(12) United States Patent
Iwamatsu et al.

(10) Patent No.: US 6,495,898 B1
(45) Date of Patent: Dec. 17, 2002

(54) SEMICONDUCTOR DEVICE AND METHOD OF MANUFACTURING THE SAME

(75) Inventors: Toshiaki Iwamatsu; Takashi Ipposhi; Takuji Matsumoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/639,953

(22) Filed: Aug. 17, 2000

(30) Foreign Application Priority Data

Feb. 17, 2000 (JP) ......................................... 2000-039484

(51) Int. Cl.$^7$ .............................................. H01L 29/00
(52) U.S. Cl. .................. 257/506; 257/509; 257/510; 438/405; 438/410; 438/425; 438/427
(58) Field of Search ................................ 438/425, 410, 438/404, 405, 427, 444, 435, 219, 221; 257/506, 509, 510

(56) References Cited

U.S. PATENT DOCUMENTS

| | | | |
|---|---|---|---|
| 4,399,605 A | | 8/1983 | Dash et al. |
| 5,399,507 A | * | 3/1995 | Sun |
| 5,484,738 A | * | 1/1996 | Chu et al. |
| 5,712,205 A | * | 1/1998 | Park et al. .................. 438/425 |
| 5,728,620 A | * | 3/1998 | Park ............................. 438/425 |
| 5,780,352 A | * | 7/1998 | Park et al. .................. 438/404 |
| 5,858,842 A | * | 1/1999 | Park ............................. 438/297 |
| 5,985,733 A | * | 11/1999 | Koh et al. .................... 438/410 |
| 6,221,737 B1 | * | 4/2001 | Letavic et al. .............. 438/439 |
| 6,222,234 B1 | | 4/2001 | Imai |
| 6,271,070 B2 | * | 8/2001 | Kotani et al. ............... 438/207 |
| 6,278,156 B1 | | 8/2001 | Kobayashi |

FOREIGN PATENT DOCUMENTS

| | | |
|---|---|---|
| JP | 01122158 A | 5/1989 |
| JP | 11-145277 | 5/1999 |
| JP | 11298001 A | 10/1999 |

OTHER PUBLICATIONS

Y. Hirano, et al., "Bulk–Layout–Compatible 0.18μm SOI–CMOS Technology Using Body–Fixed Partial Trench Isolation (PTI)", 1999 IEEE International SOI Conference, Oct. 1999, pp. 131–132.

Y. Hirano, et al., "Bulk–Layout Compatible 0.18 μm SOI–CMOS Technology Using Body–Tied Partial Trench Isolation (PTI)", The Electrochemical Society of Japan, Electronic Materials Committee, Proceedings of the 57$^{th}$ Symposium on Semiconductors and Integrated Circuits Technology, Tokyo, Dec, 9–10, 1999, pp. 19–24.

T. Iwamatsu, et al., "CAD–Compatible High–Speed CMOS/ SIMOX Technology Using Field–Shield Isolation for 1M Gate Array", IEDM Technical Digest, International Electron Devices Meeting, Washington, D.C., Dec. 5–8, 1993, pp. 475–478.

A. Chatterjee, et al., "A Shallow Trench Isolation Using LOCOS Edge for Preventing Corner Effects for 0.25/0.18 μm CMOS Technologies and Beyond", IEDM Technical Digest, 1996, pp. 829–831.

* cited by examiner

Primary Examiner—Trung Dang
(74) Attorney, Agent, or Firm—Oblon, Spivak, McClelland, Maier & Neustadt, P.C.

(57) ABSTRACT

In a combined isolation oxide film (BT1), a part closer to a gate electrode (GT13) reaches a buried oxide film (2) through an SOI layer (3) while a part closer to another gate electrode (GT12) has a sectional shape provided with a well region on its lower portion. The shape of an edge portion of the combined isolation oxide film (BT1) is in the form of a bird's beak in a LOCOS isolation oxide film. Consequently, the thicknesses of portions defining edge portions of the gate oxide films (GO12, GO13) are locally increased. Thus provided are a semiconductor device including a MOS transistor having a gate oxide film prevented from dielectric breakdown without increasing its thickness and a method of manufacturing the same.

8 Claims, 25 Drawing Sheets

F I G. 31
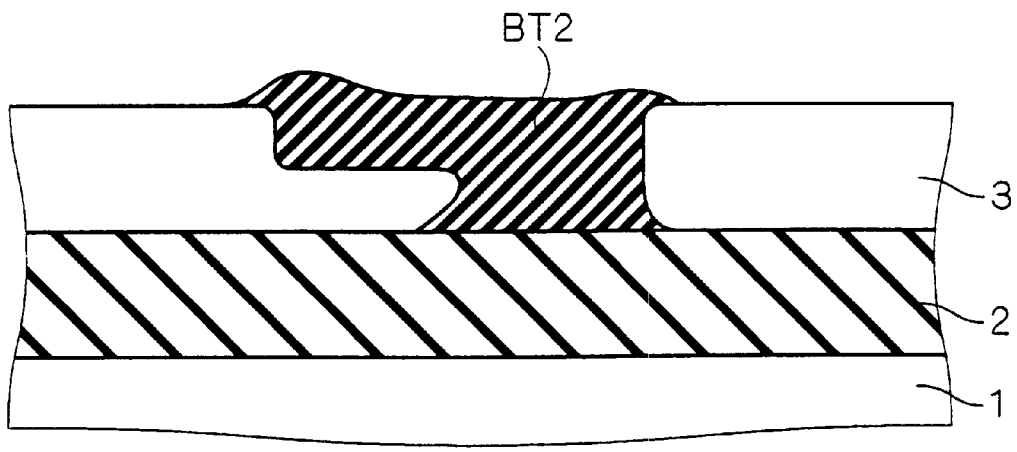
F I G. 32
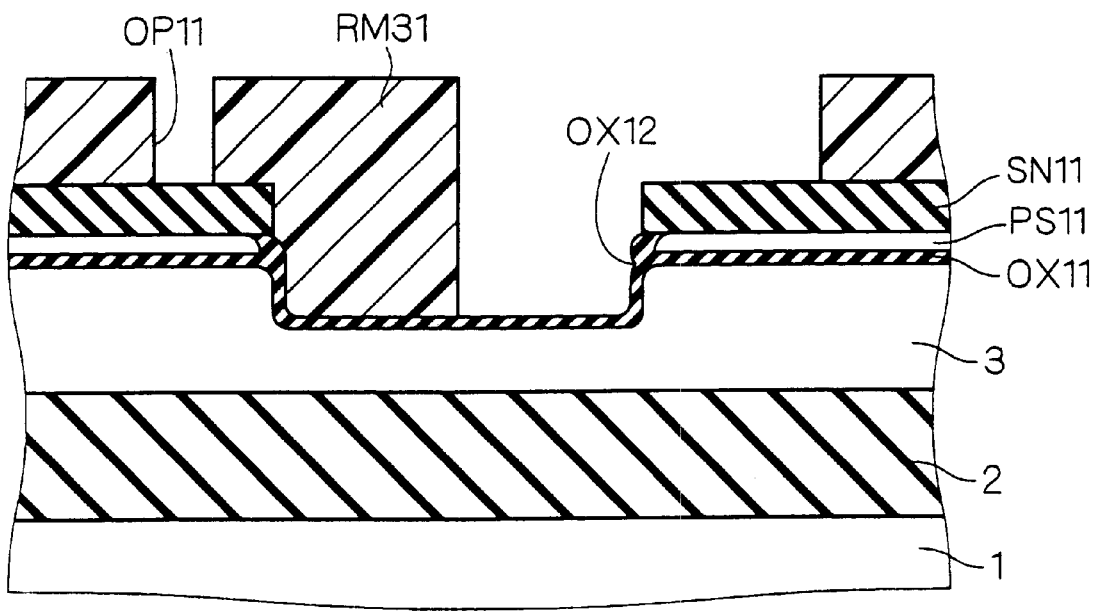

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, it relates to a semiconductor device including a MOS transistor having a gate oxide film prevented from dielectric breakdown and a method of manufacturing the same.

2. Description of the Background Art

A semiconductor device (hereinafter referred to as an SOI device) having an SOI (silicon on insulator) structure formed on an SOI substrate including a buried oxide film and an SOI layer arranged on a silicon substrate, which can reduce parasitic capacitance and operate at a high speed with lower power consumption, is employed for a portable device or the like.

FIG. 41 shows a partially fragmented sectional structure of an exemplary SOI device 70 electrically isolating MOS transistors by trench isolation.

Referring to FIG. 41, an SOI substrate includes a buried oxide film 2 and an SOI layer 3 arranged on a silicon substrate 1, and an N-channel MOS transistor (NMOS transistor) N1 and a P-channel MOS transistor (PMOS transistor) P1 are arranged on the SOI layer 3 while an isolation oxide film 4 completely electrically isolates these MOS transistors N1 and P1 from each other. The isolation oxide film 4 is so arranged as to enclose the NMOS transistor N1 and the PMOS transistor P1.

Each of the NMOS transistor N1 and the PMOS transistor P1 is formed by source/drain regions SD and a channel forming region CH formed in the SOI layer 3, a gate oxide film GO formed on the channel forming region CH, a gate electrode GT formed on the gate oxide film GO and side wall oxide films SW covering the side surfaces of the gate electrode GT.

Thus, in the SOI device 70, the NMOS transistor N1 and the PMOS transistor P1 are not only independent of each other in the SOI layer 3 due to the isolation oxide film 4 but also completely isolated from other semiconductor elements etc., whereby no latch-up takes place in principle in these transistors N1 and P1.

When manufacturing an SOI device having a CMOS transistor, therefore, the minimum isolation width decided by a microlithography can be used and the chip area can be advantageously reduced. However, a substrate floating effect causes various problems such that carriers (holes in an NMOS transistor) generated by impact ionization are collected in the channel forming region to result in kinks or deteriorate an operating withstand voltage and such that instability of the potential of the channel forming region results in frequency dependency of a delay time.

In this regard, a partial trench isolation structure has been devised. FIG. 42 is a partially fragmented sectional view showing an SOI device 80 having such a partial trench isolation structure (PTI structure).

Referring to FIG. 42, an NMOS transistor N1 and a PMOS transistor P1 are arranged on an SOI layer 3 while a partial isolation oxide film 5 having a well region WR arranged on its lower portion isolates the NMOS transistor N1 and the PMOS transistor P1 from each other. The partial isolation oxide film 5 is so arranged as to enclose the NMOS transistor N1 and the PMOS transistor P1.

With respect to the partial isolation oxide film 5, a structure such as that of the isolation oxide film 4 in the SOI device 70 completely electrically isolating elements with a trench oxide film reaching the buried oxide film 2 is referred to as a full trench isolation structure (FTI structure), and the oxide film is referred to as a full isolation oxide film.

While the partial isolation oxide film 5 isolates the NMOS transistor N1 and the PMOS transistor P1 from each other, carriers are movable through the well region WR on the lower portion of the partial isolation oxide film 5 and can be prevented from being collected in channel forming regions while the potential of the channel forming regions can be fixed through the well region WR, whereby no problems are caused by a substrate floating effect.

Whether an SOI device employs the PTI structure or the FTI structure, however, new manufacturing steps must be added for increasing the thickness of gate oxide films in order to improve reliability of MOS transistors and adjusting the quantity of an impurity injected into channels in order to reduce threshold voltages.

A method of manufacturing an SOI device 90 having a PTI structure improving reliability of MOS transistors is now described with reference to FIGS. 43 to 50.

First, an SOI substrate structured by a silicon substrate 1, a buried oxide film 2 and an SOI layer 3, formed by a SIMOX method forming the buried oxide film 2 by oxygen ion implantation or a bonding method is prepared. In general, the thickness of the SOI layer 3 is 50 to 200 nm, and the thickness of the buried oxide film 2 is 100 to 400 nm. As shown in FIG. 43, an oxide film 6 of about 10 to 30 nm (100 to 300 Å) in thickness is formed on the SOI substrate by CVD or thermal oxidation, and a nitride film 7 of 30 to 200 nm (300 to 2000 Å) in thickness is formed thereon. Then, a resist mask RM1 is formed on the nitride film 7 by patterning. The resist mask RM1 has an opening for forming a trench.

Then, the resist mask RM1 is employed as a mask for patterning the nitride film 7, the oxide film 6 and the SOI layer 3 by etching thereby forming a partial trench TR in the SOI layer 3, as shown in FIG. 44. In this etching, etching conditions are so adjusted as not to completely etch the SOI layer 3 and expose the buried oxide film 2 but to leave the SOI layer 3 on the bottom of the trench TR in a prescribed thickness.

The partial trench TR1 is formed to extend substantially perpendicularly to the silicon substrate 1 with a prescribed width, whereby element isolation can be performed while maintaining refinement without deteriorating the degree of integration.

In a step shown in FIG. 45, an oxide film of about 500 nm (5000 Å) in thickness is deposited, a portion up to an intermediate portion of the nitride film 7 is polished by CMP (chemical mechanical polishing), and thereafter the nitride film 7 and the oxide film 6 are removed thereby forming a partial isolation oxide film 5. It is assumed here that the region located on the left side of the partial isolation oxide film 5 in FIG. 45 is a first region R1 for forming a transistor having a low threshold voltage while the region located on the right side of the partial isolation oxide film 5 is a second region R2 for forming a highly reliable transistor having a general threshold voltage.

In a step shown in FIG. 46, an oxide film OX1 is formed on the overall area of the SOI layer 3. The thickness of the oxide film OX1 is 1 to 4 nm (10 to 40 Å). Thereafter a resist mask RM2 is formed to cover the second region R2, and a semiconductor impurity is introduced into the SOI layer 3 of the first region R1 by ion implantation through the oxide film OX1. As to the conditions for this implantation for forming the transistor having a low threshold voltage, boron (B) ions are implanted with energy of 5 to 40 keV and in a dose of $1\times10^{11}$ to $3\times10^{11}/cm^2$ when forming an NMOS transistor, for example. In advance of this step, boron ions are implanted with energy of 30 to 100 keV and in a dose of $1\times10^{12}$ to $1\times10^{14}/cm^2$ for forming a well region.

In a step shown in FIG. 47, a resist mask RM3 is formed to cover the first region R1, and a semiconductor impurity is introduced into the SOI layer 3 of the second region R2 by ion implantation through the oxide film OX1. As to the conditions for this implantation for forming the transistor having a general threshold voltage, boron (B) ions are implanted with energy of 5 to 40 keV and in a dose of $3\times10^{11}$ to $5\times10^{11}/cm^2$ when forming an NMOS transistor, for example.

In a step shown in FIG. 48, a resist mask RM4 is formed to cover the second region R2, and the oxide film OX1 is removed from the first region R1.

The resist mask RM4 is removed and thereafter an oxide film is formed on the overall area in a step shown in FIG. 49. At this time, an oxide film OX2 of 2 to 4 nm (20 to 40 Å) in thickness is formed on the region R1, while the thickness of the oxide film OX1 is increased to define an oxide film OX3 on the region R2. Thereafter a polycrystalline silicon layer (hereinafter referred to as a polysilicon layer) PS1 defining gate electrodes is formed on the overall area.

In a step shown in FIG. 50, the polysilicon layer PS1 and the oxide films OX2 and OX3 are patterned for forming gate electrodes GT1 and GT2 and gate oxide films GO1 and GO2 and forming NMOS transistors N3 and N4 by forming side wall oxide films SW and source/drain layers SD. A well region WR is provided on a lower portion of the partial isolation oxide film 5.

An interlayer isolation film is formed on the NMOS transistors N3 and N4 and a plurality of contact holes reaching the source/drain layers SD through the interlayer isolation film are formed to structure the SOI device 90, while illustration of these elements is omitted.

Thus, the thickness of gate oxide film is generally increased for forming the transistor having high reliability thereby preventing the gate oxide film from dielectric breakdown, with requirement for steps of forming resist masks. When increasing the thickness of the gate oxide film, however, there is a possibility of such a problem that the transistor characteristics are deteriorated.

SUMMARY OF THE INVENTION

According to a first aspect of the present invention, a semiconductor device comprises a semiconductor substrate, a plurality of semiconductor elements formed on the semiconductor substrate and a trench isolation oxide film obtained by burying an oxide film in a trench formed in the surface of the semiconductor substrate for electrically isolating the plurality of semiconductor elements by the trench isolation oxide film, while trench isolation oxide film has different contour shapes of the upper edge portion on the left and right edges in a brachydirectional section of the trench isolation oxide film.

In the semiconductor device according to the first aspect of the present invention, the trench isolation oxide film has different contour shapes of the upper edge portion on the left and right edges in the brachydirectional section of the trench isolation oxide film, whereby gate oxide films of MOS transistors formed on the left and right sides of the trench isolation oxide film can have different thicknesses and the shapes of the edge portions of the gate oxide films can be optimized in response to MOS transistors having different specs.

According to a second aspect of the present invention, the semiconductor substrate is an SOI substrate comprising a silicon substrate, a buried oxide film arranged on the silicon substrate and an SOI layer arranged on the buried oxide film, and the trench isolation oxide film is arranged in the surface of the SOI substrate.

In the semiconductor device according to the second aspect, the semiconductor substrate is an SOI substrate and the trench isolation oxide film is arranged in the surface of the SOI substrate, whereby the semiconductor device can attain high reliability while preventing gate oxide films of SOIMOS transistors from dielectric breakdown. Further, only the thickness of the edge portions of the gate oxide films is increased, and hence the transistor characteristics are not deteriorated dissimilarly to the case of increasing the overall thickness of the gate oxide films.

According to a third aspect of the present invention, the trench isolation oxide film has such a contour shape that its upper edge portion projects into the surface of the semiconductor substrate in the form of a bird's beak.

In the semiconductor device according to the third aspect, the upper edge portion of the trench isolation oxide film has the contour shape projecting into the surface of the semiconductor substrate in the form of a bird's beak. When the semiconductor elements are MOS transistors, therefore, the thickness of edge portions of gate oxide films is consequently increased by forming the gate oxide films to engage with the bird's beak of the trench isolation oxide film, and the semiconductor device can attain high reliability while preventing the gate oxide films from dielectric breakdown in the vicinity of edge portions of gate electrodes where an electric field readily concentrates. Further, only the thickness of the edge portions of the gate oxide films is increased, and hence the transistor characteristics are not deteriorated dissimilarly to the case of increasing the overall thickness of the gate oxide films.

According to a fourth aspect of the present invention, the trench isolation oxide film has different shapes on the left and right sides in its brachydirectional section, and combinationally includes a full trench structure reaching the buried oxide film through the SOI layer and a partial trench structure having the SOI layer on its lower portion.

In the semiconductor device according to the fourth aspect, the trench isolation film combinationally has the full trench structure and the partial trench structure, whereby the upper edge portion can readily have different contour shapes on the sides of the full trench structure and the partial trench structure in the process of formation thereof.

According to a fifth aspect of the present invention, the height of a protrusion on a base portion of the upper edge portion projecting in the form of the bird's beak on the side of the full trench structure is relatively small, and the height of a protrusion on a base portion of the upper edge portion projecting in the form of the bird's beak on the side of the partial trench structure is relatively large in the trench isolation oxide film.

In the semiconductor device according to the fifth aspect, the height of the protrusion on the base portion of the upper edge portion projecting in the form of the bird's beak on the side of the full trench structure is relatively small and the height of the protrusion on the base portion of the upper edge portion projecting in the form of the bird's beak on the side of the partial trench structure is relatively large, whereby the thickness of the edge portion of the gate oxide film can be reduced in the MOS transistor engaging with the full trench structure side so that a gate oxide film suitable for the MOS transistor whose transistor characteristics are set with the characteristics of a parasitic transistor can be obtained while the thickness of the edge portion of the gate oxide film can be increased in the MOS transistor engaging with the partial trench structure side and hence a gate oxide film suitable for a MOS transistor requiring improvement in reliability of the gate oxide film can be obtained.

According to a sixth aspect of the present invention, the length of the upper edge portion projecting in the form of the bird's beak on the side of the full trench structure is relatively large, and the length of the upper edge portion projecting in the form of the bird's beak on the side of the partial trench structure is relatively small in the trench isolation oxide film.

In the semiconductor device according to the sixth aspect, the length of the upper edge portion projecting in the form of the bird's beak on the side of the full trench structure is relatively large and the length of the upper edge portion projecting in the form of the bird's beak on the side of the partial trench structure is relatively small, whereby the shapes of the edge portions of the gate oxide films can be optimized in response to MOS transistors having different specs.

According to a seventh aspect of the present invention, the trench isolation oxide film has different contour shapes of a base portion of the upper edge portion projecting in the form of the bird's beak on the side of the partial trench structure between a first inclined portion along a direction separating from the SOI layer and a second inclined portion directed toward the SOI layer, the first inclined portion has a substantially linear contour shape, and the second inclined portion has a contour shape roundedly projecting toward the SOI layer.

In the semiconductor device according to the seventh aspect, the first inclined portion of the upper edge portion on the side of the partial trench structure has a substantially linear contour shape and hence an unnecessary gate material can be prevented from remaining on the surface of the isolation oxide film when removing the gate material in gate electrode formation. Further, the second inclined portion has a contour shape roundedly projecting toward the SOI layer, whereby stress caused in the vicinity of the interface between the SOI layer and the isolation oxide film resulting from heat treatment or oxidation performed in the process of manufacturing the semiconductor device can be relaxed and the SOI layer can be inhibited from formation of crystal defects resulting from such stress.

According to an eighth aspect of the present invention, the trench isolation oxide film has different contour shapes of a base portion of the upper edge portion projecting in the form of the bird's beak on the side of the partial trench structure between a first inclined portion along a direction separating from the SOI layer and a second inclined portion directed toward the SOI layer, the first inclined portion has a contour shape roundedly depressed toward the SOI layer, and the second inclined portion has a contour shape roundedly projecting toward the SOI layer.

In the semiconductor device according to the eighth aspect, the first inclined portion of the upper edge portion on the side of the partial trench structure has the contour shape roundedly depressed toward the SOI layer, whereby an effect of preventing an unnecessary gate material from remaining on the surface of the isolation oxide film is increased when removing the gate material in gate electrode formation while a step projecting from the main surface of the SOI layer can be reduced by reducing the thickness of the edge portion of the trench isolation oxide film thereby simplifying a step of forming gate electrodes or the like. Further, the second inclined portion has the contour shape roundedly projecting toward the SOI layer, whereby stress caused in the vicinity of the interface between the SOI layer and the isolation oxide film resulting from heat treatment or oxidation performed in the process of manufacturing the semiconductor device can be relaxed and the SOI layer can be inhibited from formation of crystal defects resulting from such stress.

According to a ninth aspect of the present invention, the trench isolation oxide film has such a contour shape that its lower edge portion projects between the SOI layer and the buried oxide film.

In the semiconductor device according to the ninth aspect, the lower edge portion of the trench isolation oxide film has the contour shape projecting between the SOI layer and the buried oxide film, whereby the interfacial state between the SOI layer and the buried oxide film can be improved.

According to a tenth aspect of the present invention, a method of manufacturing a semiconductor device comprises steps of (a) preparing an SOI substrate comprising a silicon substrate, a buried oxide film arranged on the silicon substrate and an SOI layer arranged on the buried oxide film, (b) forming an oxide extension layer on the SOI layer, (c) forming a mask layer having a prescribed opening pattern on the oxide extension layer, (d) forming a trench by selectively removing the SOI layer through the mask layer without passing through the SOI layer from the surface, (e) forming a resist mask having an opening at a first region between a prescribed position at least on the bottom surface of the trench and a first side wall surface in a brachydirectional section, and covering a second region between at least the prescribed position and a second side wall surface in the brachydirectional section, (f) removing the trench to reach the buried oxide film through the resist mask for forming a combined trench having a portion corresponding to the second region being a partial trench having the SOI layer on its lower portion and a portion corresponding to the first region being a full trench passing through the SOI layer, (g) forming a first oxide film on the inner wall of the combined trench by thermally oxidizing the inner wall of the buried trench and the oxide extension layer and (h) forming a trench isolation oxide film combinationally having a full trench structure reaching the buried oxide film through the SOI layer and a partial trench structure having the SOI layer on its lower portion by filling up the combined trench with a second oxide film.

In the method of manufacturing a semiconductor device according to the tenth aspect, a trench isolation oxide film combinationally having a full trench structure reaching the buried oxide film through the SOI layer and a partial trench structure having the SOI layer on its lower portion can be obtained. Further, this trench isolation oxide film has such a contour shape that its upper edge portion projects into the surface of the SOI layer in the form of a bird's beak while the contour shape differs on the left and right edges in a brachydirectional section.

According to an eleventh aspect of the present invention, the oxide extension layer includes an oxide film arranged on the SOI layer and a polycrystalline silicon layer arranged on the oxide film.

In the method of manufacturing a semiconductor device according to the twelfth aspect, the oxide extension layer includes the oxide film arranged on the SOI layer and the polycrystalline silicon layer arranged on the oxide film, whereby the polycrystalline silicon layer is oxidized in formation of the first oxide film so that the bird's beak on the upper edge portion of the trench isolation oxide film has a clearer shape.

According to a twelfth aspect of the present invention, the step (h) includes steps of (h-1) forming the second oxide film to fill up the combined trench and cover the overall area on the mask layer, and (h-2) planarizing the second oxide film by chemical mechanical polishing through the mask layer serving as a stopper.

In the method of manufacturing a semiconductor device according to the twelfth aspect, the second oxide film is planarized by chemical mechanical polishing through the mask layer serving as a stopper, whereby the shape of the edge portion of the trench isolation oxide film can be adjusted by adjusting the degree of planarizing.

According to a thirteenth aspect of the present invention, the opening of the resist mask is provided over the first region and a first edge portion of the mask layer adjacent to the first region, and the first edge portion of the mask layer is removed to have a step in association with formation of the combined trench so that the thickness of the mask layer is partially reduced.

In the method of manufacturing a semiconductor device according to the fourteenth aspect, the first edge portion of the mask layer is removed to be thin with the step so that the thickness of the second oxide film is reduced on the portion of the full trench and increased on the portion of the partial trench, whereby such a trench isolation oxide film can be finally obtained that the height of the protrusion on the base portion of the upper edge portion projecting in the form of the bird's beak is relatively small on the side of the full trench structure and the height of the protrusion on the base portion of the upper edge portion projecting in the form of the bird's beak is relatively large on the side of the partial trench structure.

According to a fourteenth aspect of the present invention, the resist mask further includes a local opening arranged on at least either a first prescribed region of a first edge portion of the mask layer adjacent to the first region or a second prescribed region of a second edge portion of the mask layer adjacent to the second region, and a concave portion is formed in at least either the first prescribed region or the second prescribed region of the mask layer in association with formation of the combined trench.

In the method of manufacturing a semiconductor device according to the fourteenth aspect, the concave portion is formed in at least either the first prescribed region or the second prescribed region of the mask layer in association with formation of the combined trench for defining a protrusion, while the thickness of the second oxide film located on this protrusion is reduced when the second oxide film is formed by high-density plasma CVD and the protrusion is also polished when performing planarizing by chemical mechanical polishing, whereby the edge portion of the mask layer can consequently be brought into a shape thinned with a step.

According to a fifteenth aspect of the present invention, the method of manufacturing a semiconductor device further comprises a step of performing annealing in a nitrogen atmosphere, a hydrogen atmosphere or an argon atmosphere in a stage at least either before or after formation of the first oxide film.

In the method of manufacturing a semiconductor device according to the fifteenth aspect, crystallinity on the outermost surface of the SOI layer can be improved by performing annealing in a nitrogen atmosphere, a hydrogen atmosphere or an argon atmosphere before formation of the first oxide film, while stress on the SOI layer following heat treatment can be relaxed when performing the said annealing after oxidation.

According to a sixteenth aspect of the present invention, a method of manufacturing a semiconductor device comprises steps of (a) preparing an SOI substrate comprising a silicon substrate, a buried oxide film arranged on the silicon substrate and an SOI layer arranged on the buried oxide film, (b) forming an oxide extension layer on the SOI layer, (c) forming a mask layer having a prescribed opening pattern on the oxide extension layer, (d) forming a trench by selectively removing the SOI layer through the mask layer without passing through the SOI layer from the surface, (e) forming a first oxide film on the inner wall of the trench by thermally oxidizing the inner wall of the trench and the oxide extension layer, (f) forming a resist mask having an opening at a first region between a prescribed position at least on the bottom surface of the trench and a first side wall surface in a brachydirectional section, and covering a second region between at least the prescribed position and a second side wall surface in the brachydirectional section, (g) removing the trench to reach the buried oxide film through the resist mask for forming a combined trench having a portion corresponding to the second region being a partial trench having the SOI layer on its lower portion and a portion corresponding to the first region being a full trench passing through the SOI layer and (h) forming a trench isolation oxide film combinationally having a full trench structure reaching the buried oxide film through the SOI layer and a partial trench structure having the SOI layer on its lower portion by filling up the combined trench with a second oxide film.

In the method of manufacturing a semiconductor device according to the seventeenth aspect, a trench isolation oxide film combinationally having a full trench structure reaching the buried oxide film through the SOI layer and a partial trench structure having the SOI layer on its lower portion can be obtained. This trench isolation oxide film has such a contour shape that its upper edge portion projects into the surface of the SOI layer in the form of a bird's beak while the contour shape is similar on the left and right edges in a brachydirectional section.

An object of the present invention is to provide a semiconductor device including a MOS transistor having a gate oxide film prevented from dielectric breakdown without increasing the thickness thereof and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 26 to 31 are sectional views illustrating the details of steps of manufacturing a semiconductor device according to an embodiment 2 of the present invention;

FIGS. 32 to 38 are sectional views illustrating steps of manufacturing a modification of the semiconductor device according to the embodiment 2 of the present invention;

DESCRIPTION OF THE PREFERRED EMBODIMENTS

<A. Embodiment 1>

<A-1. Device Structure>

Figure 1:
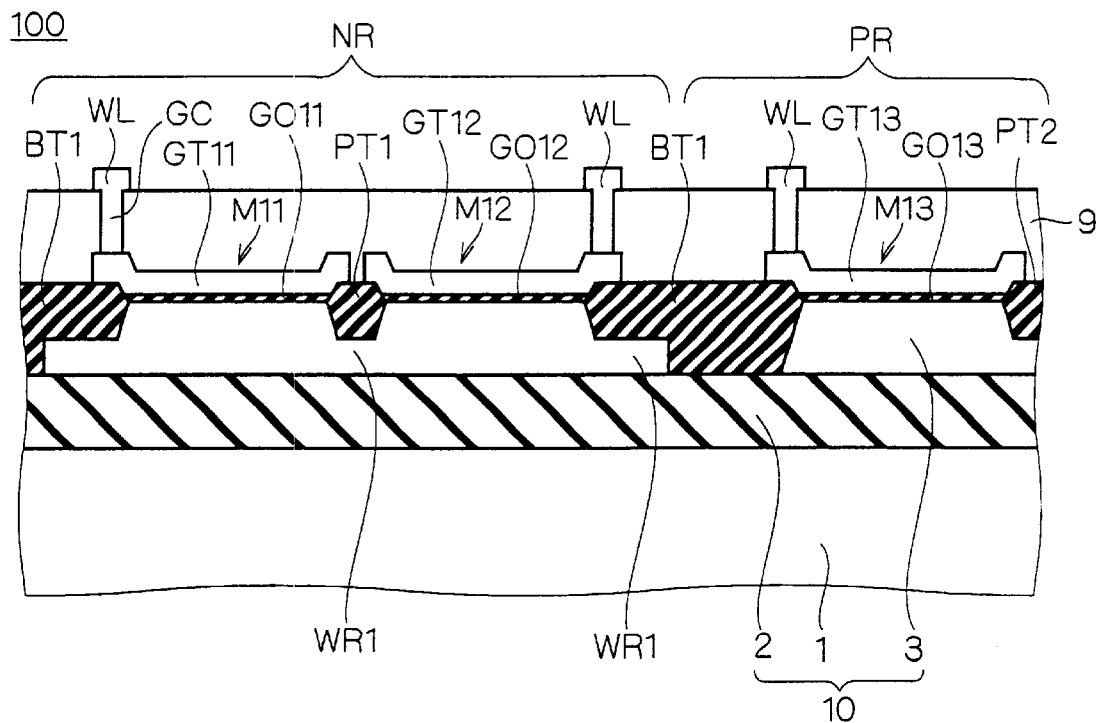
FIG. 1 is a sectional view illustrating the overall structure of a semiconductor device according to an embodiment 1 of the present invention.

FIG. 1 shows a sectional structure of an SOI device 100 according to an embodiment 1 of the present invention. As shown in FIG. 1, the SOI device 100 has a region NR for forming NMOS transistors and a region PR for forming a PMOS transistor, which are formed on an SOI substrate 10 including a buried oxide film 2 and an SOI layer 3 arranged on a silicon substrate 1, with a combined isolation oxide film BT1 prepared by combining a full isolation oxide film and a partial isolation oxide film located therebetween.

The combined isolation oxide film BT1 has such a sectional shape that a part closer to the region PR reaches the buried oxide film 2 through the SOI layer 3 while a part closer to the region NR has a p-type well region WR1 on its lower portion.

Two NMOS transistors M11 and M12 are arranged on the SOI layer 3 in the region NR, and isolated from each other by a partial isolation oxide film PT1 having the well region WR1 arranged under the same.

The NMOS transistor M11 arranged on the SOI layer 3 on the left side of the partial isolation oxide film PT1 has a gate oxide film GO11 extending between the partial isolation oxide film PT1 and another combined isolation oxide film BT1 and a gate electrode GT11, arranged on the gate oxide film GO11, having ends engaging with the partial isolation oxide film PT1 and the other combined isolation oxide film BT1.

The NMOS transistor M12 arranged on the SOI layer 3 on the right side of the partial isolation oxide film PT1 has a gate oxide film GO12 extending between the partial isolation oxide film PT1 and the combined isolation oxide film BT1 and a gate electrode GT12, arranged on the gate oxide film GO12, having ends engaging with the partial isolation oxide film PT1 and the combined isolation oxide film BT1.

Another partial isolation oxide film PT2 is arranged on the SOI layer 3 in the region PR, and a PMOS transistor M13 is arranged on the SOI layer 3 between the partial isolation oxide film PT2 and the combined isolation oxide film BT1.

The PMOS transistor M13 has a gate oxide film GO13 extending between the partial isolation oxide film PT2 and the combined isolation oxide film BT1 and a gate electrode GT13, arranged on the gate oxide film GO13, having ends engaging with the partial isolation oxide film PT2 and the combined isolation oxide film BT1.

An interlayer isolation film 9 is arranged along the overall surface of the SOI substrate 10 and a plurality of gate contacts GC reaching ends of the gate electrodes GT11, GT12 and GT13 are arranged through the interlayer isolation film 9, while the gate contacts GC are connected to wiring layers WL patterned on the interlayer isolation film 9 respectively.

A plane structure of the SOI device 100 as viewed from the side of the interlayer isolation film 9 is now described with reference to FIG. 2.

Figure 2:
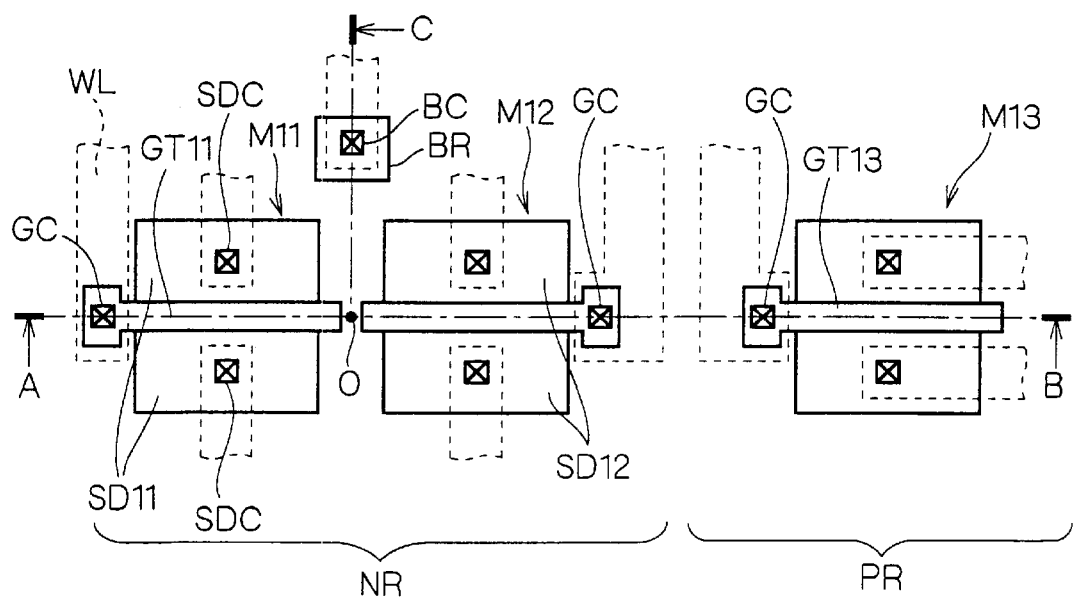
FIG. 2 is a plan view illustrating the overall structure of the semiconductor device according to the embodiment 1 of the present invention.

As shown in FIG. 2, the NMOS transistors M11 and M12 and the PMOS transistor M13 have source/drain layers SD11, SD12 and SD13 in the SOI layer 3 on both sides of the gate electrodes GT11, GT12 and GT13 respectively, and source/drain contacts SDC are connected to the source/drain layers SD11, SD12 and SD113 respectively. FIG. 1 shows a section taken along the line A–B in FIG. 2.

A body fixing region BR fixing the potential of the SOI layer 3 in the region NR is arranged in the vicinity of the NMOS transistors M11 and M12, and a body contact BC is connected to the body fixing region BR.

The combined isolation oxide film BT1 (not shown) defines the regions PR and NR, and the partial isolation oxide films PT1 and PT2 (not shown) are so arranged as to define the source/drain layers SD11, SD12 and SD13, i.e., active regions.

<A-2. Manufacturing Method>

<A-2-1. Outline of Overall Steps>

First, a method of manufacturing the SOI device 100 is described with reference to FIGS. 3 to 12 successively showing the steps thereof.

Figure 3:
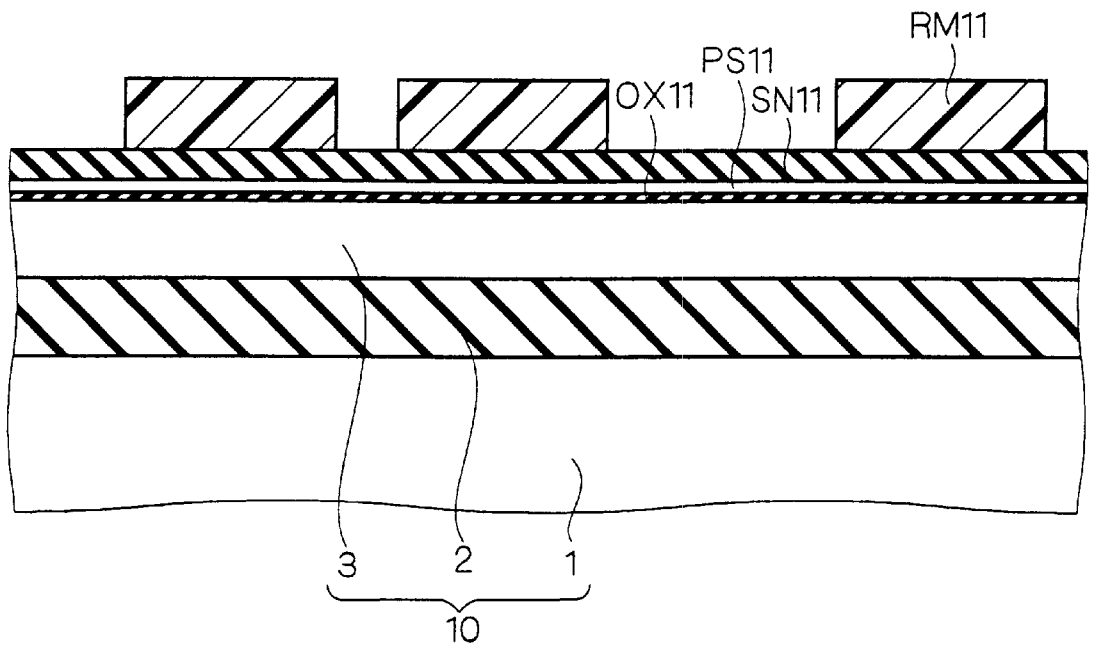
FIGS. 3 to 12 are sectional views schematically illustrating steps of manufacturing the semiconductor device according to the embodiment 1 of the present invention.

First, the SOI substrate 10 including the buried oxide film 2 and the SOI layer 3 arranged on the silicon substrate 1 is prepared as shown in FIG. 3. The SOI substrate 10 may be formed any method such as the SIMOX method, a wafer bonding method or the like. In general, the thickness of the SOI layer 3 is 50 to 200 nm, and that of the buried oxide film 2 is 100 to 400 nm.

An oxide film (oxide extension layer) OX11 of about 5 to 50 nm (50 to 500 Å) in thickness is formed on the SOI layer 3 by CVD under a temperature condition of about 800° C. This oxide film OX11 may alternatively be formed by thermally oxidizing the SOI layer 3 under a temperature condition of about 800 to 1000° C.

Then, a polysilicon layer (oxide extension layer) PS11 of 10 to 100 nm (100 to 1000 Å) in thickness is formed on the oxide film OX11 by CVD.

Then, a nitride film SN11 of 50 to 200 nm (500 to 2000 Å) in thickness is formed on the polysilicon layer PS11 by CVD under a temperature condition of about 700° C. The nitride film SN11 may be replaced with an oxynitride film containing nitrogen by about several % to several 10%, formed in a mixed atmosphere of nitrogen and oxygen.

Then, a resist mask RM11 is formed on the nitride film SN11 by patterning. The resist mask RM11 has a pattern provided with openings in portions corresponding to the positions of arrangement of the partial isolation oxide films PT1 and PT2 and the combined isolation oxide film BT1 (FIG. 1).

Figure 4:
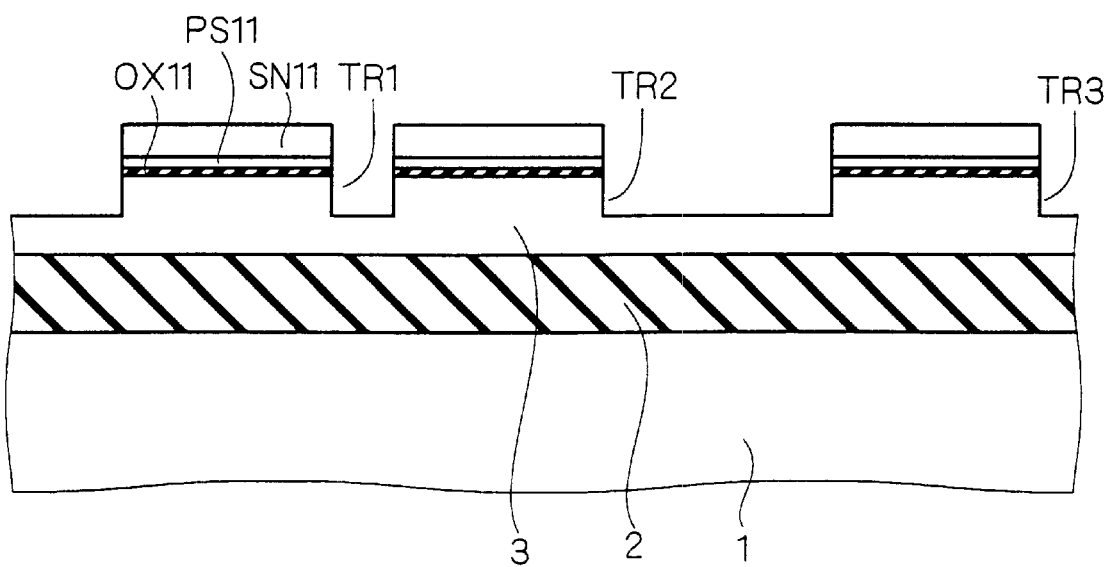

In a step shown in FIG. 4, the nitride film SN11 is etched in response to the opening pattern of the resist mask RM11 and thereafter employed as an etching mask for selectively removing the polysilicon layer PS11, the oxide film OX11 and the SOI layer 3 by dry etching and forming trenches TR1, TR2 and TR3 in correspondence to the positions for forming the partial isolation oxide films PT1 and PT2 and the combined isolation oxide film BT1.

While etching of the SOI layer 3 must be so performed as not to pass through the SOI layer 3, crystal defects are caused if the thickness of the SOI layer 3 located between the bottom portions of the trenches TR1 to TR3 and the buried oxide film 2 is excessively reduced. Therefore, the etching condition is so set that the thickness is at least about 10 nm.

Figure 5:
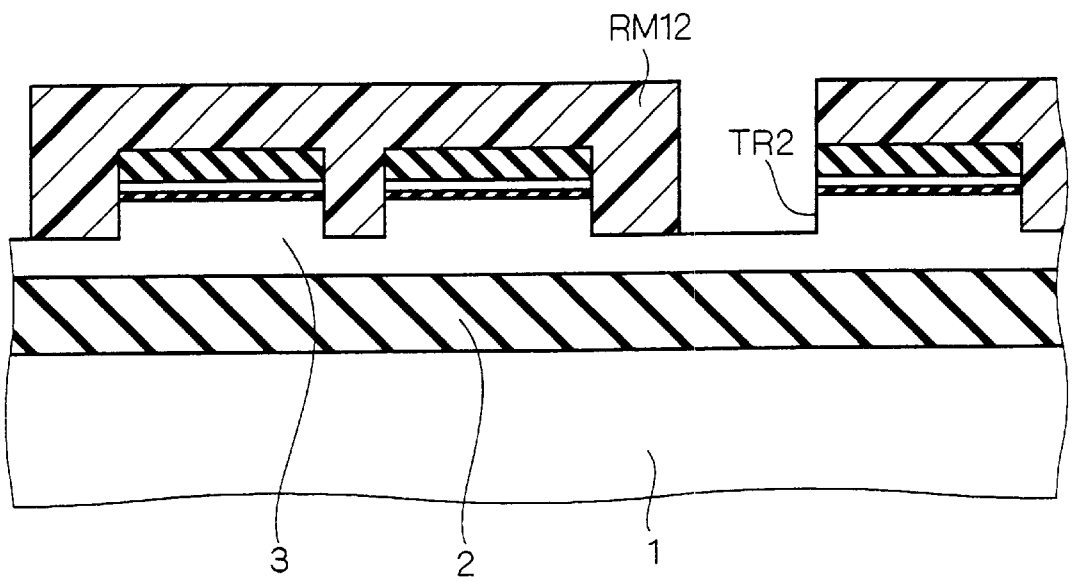

In a step shown in FIG. 5, a resist mask RM12 is formed by patterning. The resist mask RM12 has a pattern for opening only a prescribed portion of the trench TR2. More specifically, the resist mask RM12 is so patterned as to have an opening only in a region corresponding to a portion, reaching the buried oxide film 2 through the SOI layer 3, of the combined isolation oxide film BT1 (FIG. 1) formed in a later step. The trench TR2 is etched in response to the opening pattern of the resist mask RM12, for exposing the buried oxide film 2.

Figure 6:
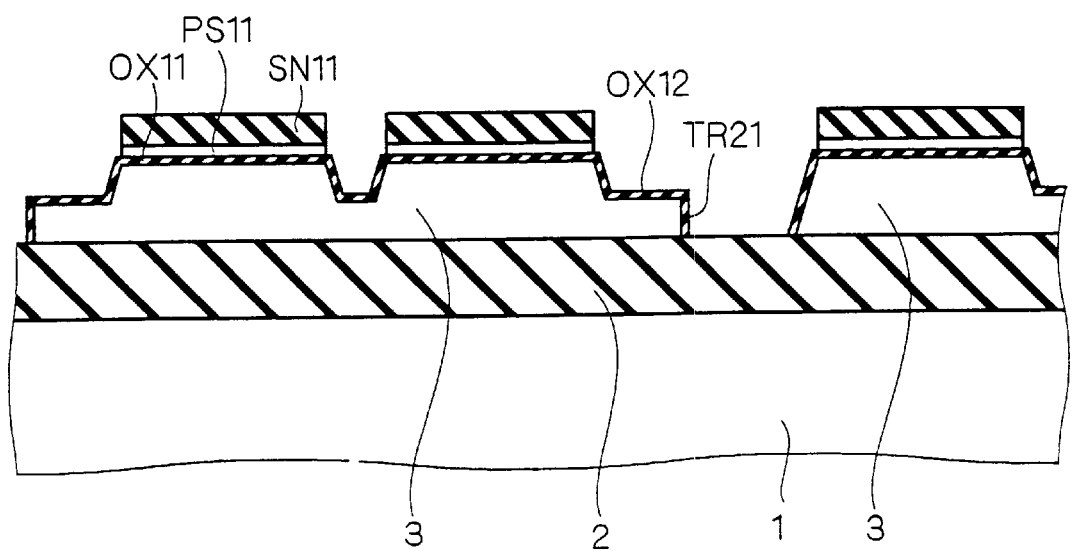

The resist mask RM12 is removed and thereafter the exposed surface of the SOI layer 3 is thermally oxidized through the nitride film SN11 serving as a mask in a step shown in FIG. 6, for forming an oxide film OX12. The trench TR2 is re-etched to define a trench TR21 having a portion passing through the SOI layer 3.

The oxide film OX12 is formed in order to remove damage caused by etching for patterning the SOI layer 3 and to obtain gate oxide films prevented from dielectric breakdown and improved in reliability.

The oxide film OX12 is formed at a temperature of about 800 to 1350° C. in a thickness of about 1 to 60 nm (10 to 600 Å). Annealing may be performed in a nitrogen atmosphere, a hydrogen atmosphere or an argon atmosphere at least either before or after oxidation. The treatment time is about 30 minutes to two hours when performing this annealing at a relatively low temperature of 600 to 900° C., while the treatment time is about two seconds to one minute when performing the annealing at a relatively high temperature of 900 to 1300° C.

Crystallinity of the outermost surface of the SOI layer 3 can be improved when performing the aforementioned annealing before oxidation, while stress applied onto the SOI layer 3 following heat treatment can be relaxed when performing the aforementioned annealing after oxidation.

Figure 7:
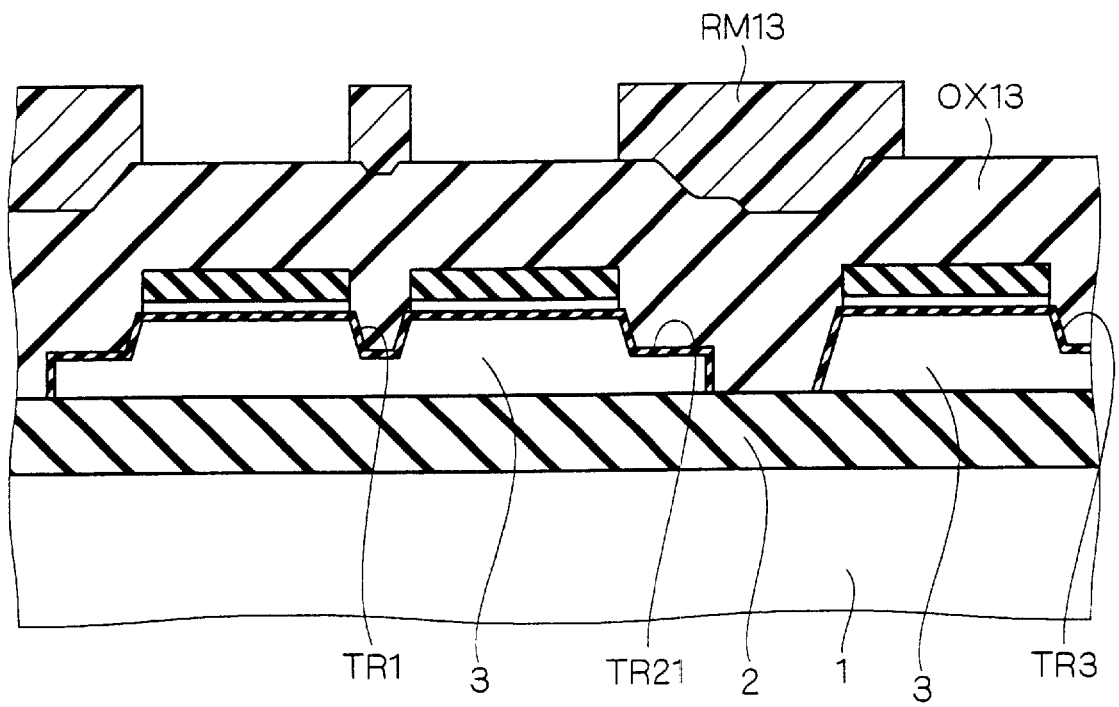

In a step shown in FIG. 7, an oxide film OX13 of about 300 to 600 nm in thickness is formed along the overall surface of the SOI substrate 10 by CVD, for completely filling up the trenches TR1, TR3 and TR21 with the oxide film OX13.

The oxide film OX13 is formed by HDP (high density plasma)-CVD, for example. The HDP-CVD, employing plasma having density higher by one or two digits than that employed in general plasma CVD for depositing an oxide film while simultaneously performing sputtering and deposition, can provide an oxide film having excellent film quality.

The oxide film OX13 has irregular portions reflecting the step shapes of the trenches TR1, TR3 and TR21 etc., and a resist mask RM13 patterned to cover the irregular portions is formed on the oxide film OX13.

Figure 8:
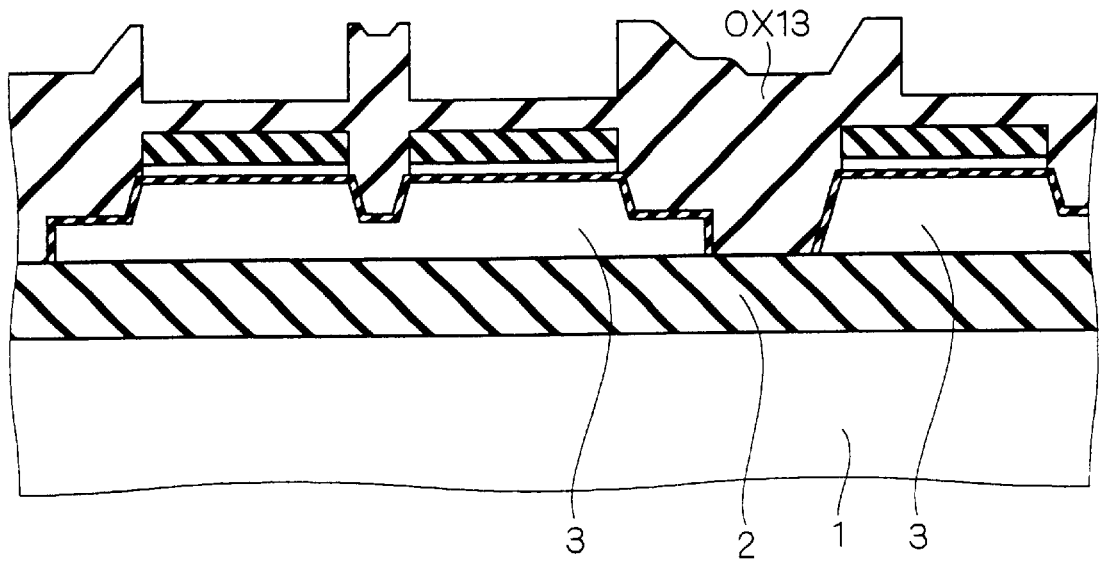

The oxide film OX13 is etched up to a prescribed depth in response to an opening pattern of the resist mask RM13, which in turn is then removed for obtaining a structure shown in FIG. 8. This treatment is performed for improving uniformity of the thickness of the oxide film OX13 after subjected to planarizing a later CMP (chemical mechanical polishing).

Figure 9:
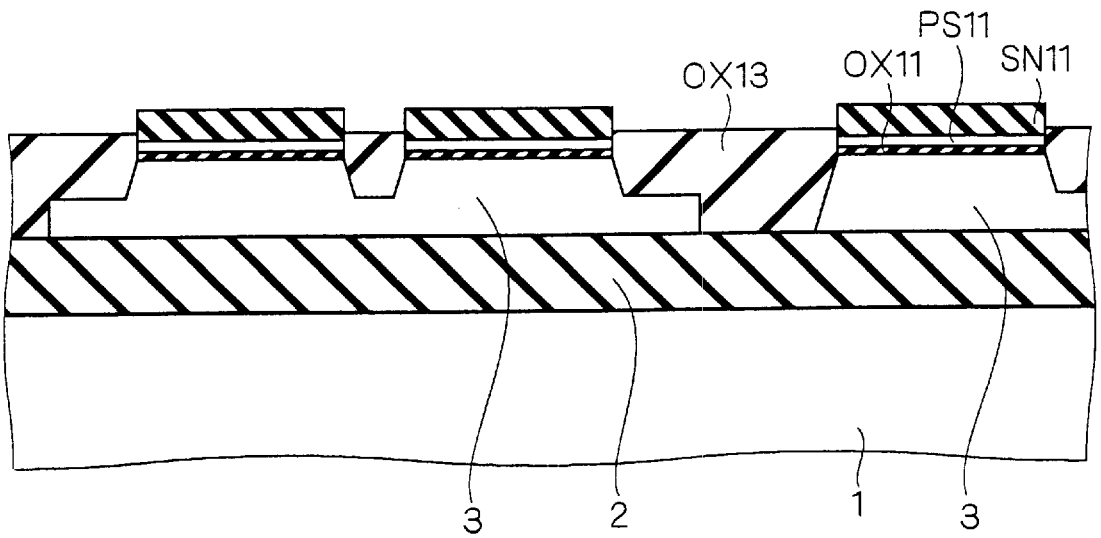

In a step shown in FIG. 9, the oxide film OX13 is polished to an intermediate portion of the nitride film SN11 by CMP to be planarized. Thereafter the nitride film SN11 and the polysilicon layer PS11 are removed by wet or dry etching, thereby shaping the partial isolation oxide films PT1 and PT2 and the combined isolation oxide film BT1 shown in FIG. 1.

Figure 10:
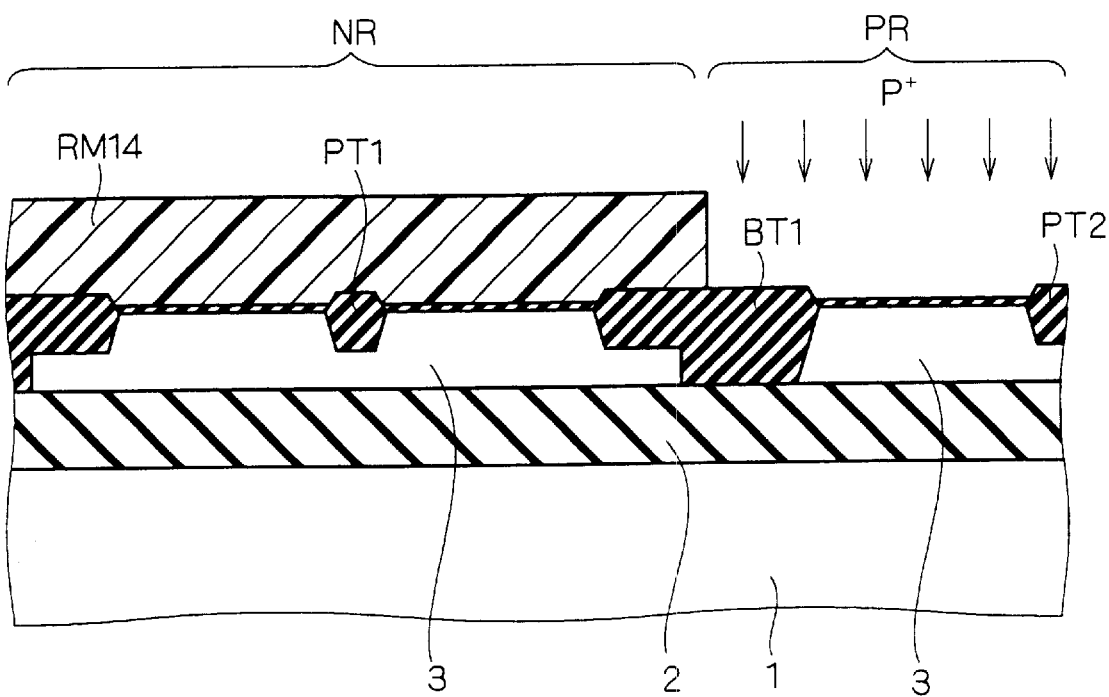

In a step shown in FIG. 10, the region NR is covered with a resist mask RM14 for ion-implanting an n-type impurity into the SOI layer 3 of the region PR through the oxide film OX11. At this time, phosphorus (P) ions are implanted with energy of 80 to 200 keV and in a dose of $3 \times 10^{11}$ to $5 \times 10^{13}/cm^2$ for suppressing punch-through, for example, and phosphorus ions are implanted in the vicinity of the surface of the SOI layer 3 with energy of 20 to 100 keV and in a dose of $3 \times 10^{11}$ to $5 \times 10^{11}/cm^2$ for setting a threshold voltage.

Figure 11:
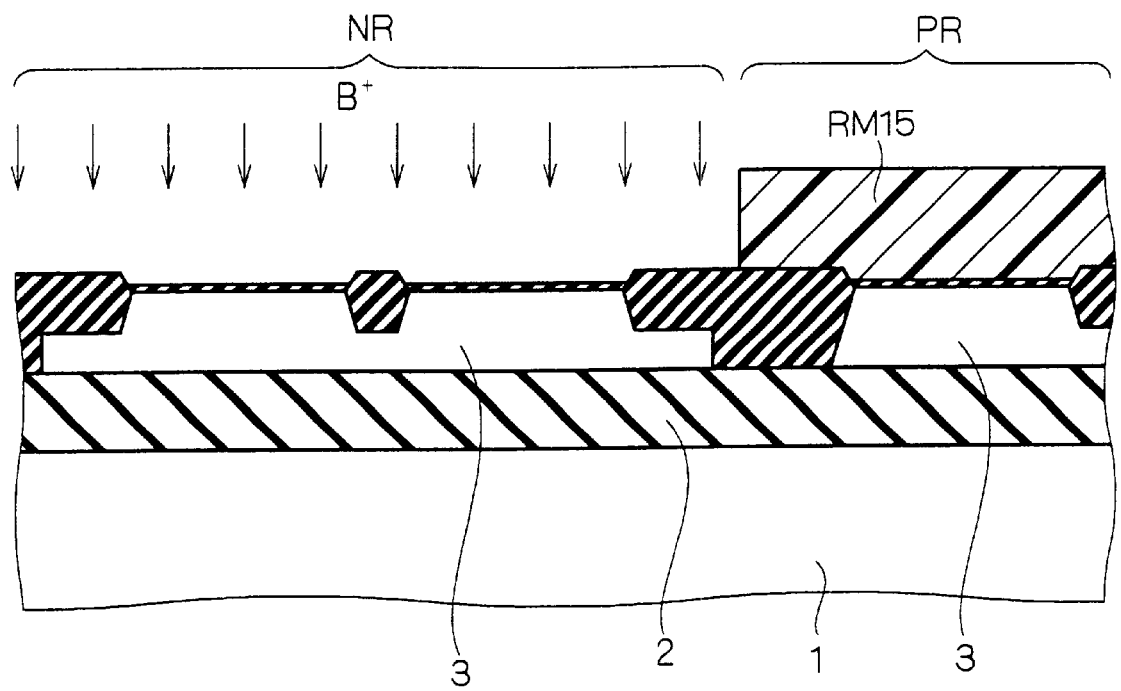

In a step shown in FIG. 11, the region PR is covered with a resist mask RM15 for ion-implanting a p-type impurity into the SOI layer 3 of the region NR through the oxide film OX11. At this time, boron ions are implanted with energy of 80 to 200 keV and in a dose of $3 \times 10^{11}$ to $5 \times 10^{13}/cm^2$ for suppressing punch-through, for example, and boron ions are implanted in the vicinity of the surface of the SOI layer 3 with energy of 5 to 40 keV and in a dose of $3 \times 10^{11}$ to $5 \times 10^{11}/cm^2$ for setting a threshold voltage.

Figure 12:
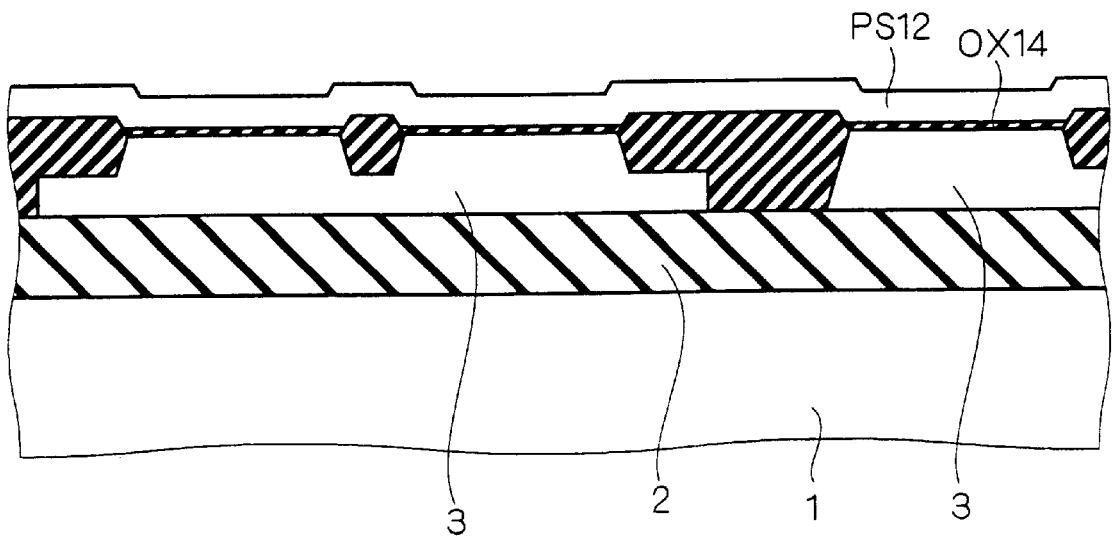

In a step shown in FIG. 12, the oxide film OX11 is removed by wet etching and thereafter an oxide film OX14 for defining the gate oxide films GO11 to GO13 is formed along the overall surface of the SOI substrate 10.

While the oxide film OX11 may alternatively removed immediately after forming the partial isolation oxide films PT1 and PT2 and the combined isolation oxide film BT1 in advance of the step shown in FIG. 10, it follows that an oxide film is formed for protecting the surface of the SOI layer 3 in ion implantation shown in FIGS. 10 and 11 in this case and this oxide film is removed before forming the oxide film OX14.

Thereafter a polysilicon film PS12 for defining the gate electrodes GT11 to GT13 is formed on the overall surface of the oxide film OX14.

Thereafter the polysilicon layer PS12 and the oxide film OX14 are patterned by an existing technique for shaping the gate electrodes GT11 to GT13 and the gate oxide films OX11 to OX13 and obtaining the SOI device 100 shown in FIG. 1 through formation of the source/drain layers SD11 to SD13, formation of the interlayer isolation film 9 and formation of the gate contacts GC and the source/drain contacts SDC.

<A-2-2. Details of Inventive Steps>

The steps of this embodiment are now described in detail with reference to FIGS. 13 to 16.

Figure 13:
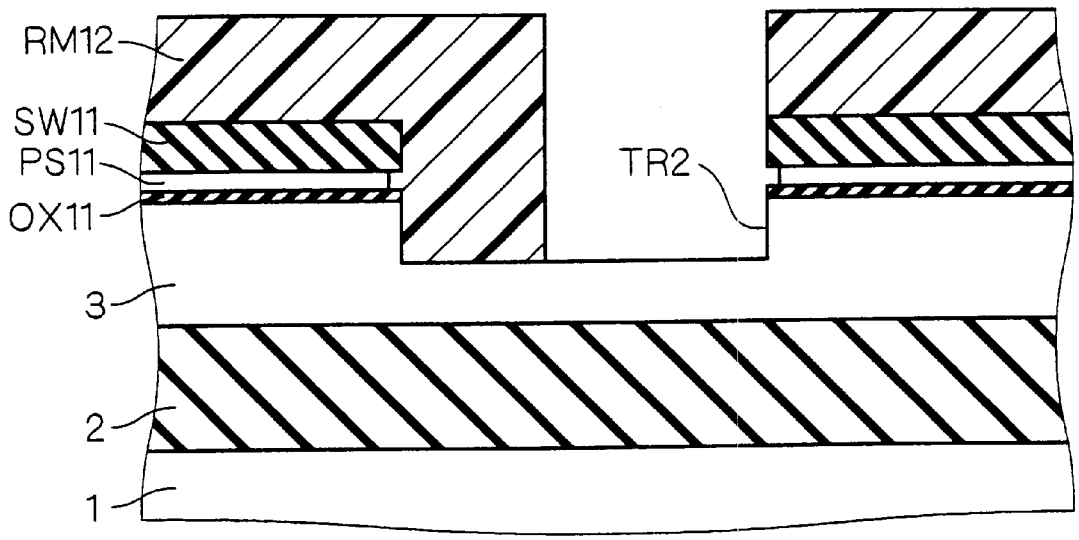
FIGS. 13 to 15 are sectional views illustrating the details of the steps of manufacturing the semiconductor device according to the embodiment 1 of the present invention.

FIG. 13 is a detailed diagram showing the step of etching the trench TR2 shown in FIG. 5. As shown in FIG. 13, the end surfaces of the polysilicon layer PS11 retreat as compared with the nitride film SN11 and the SOI layer 3 due to the anisotropic etching such as wet etching employed for forming the trench TR2.

Figure 14:
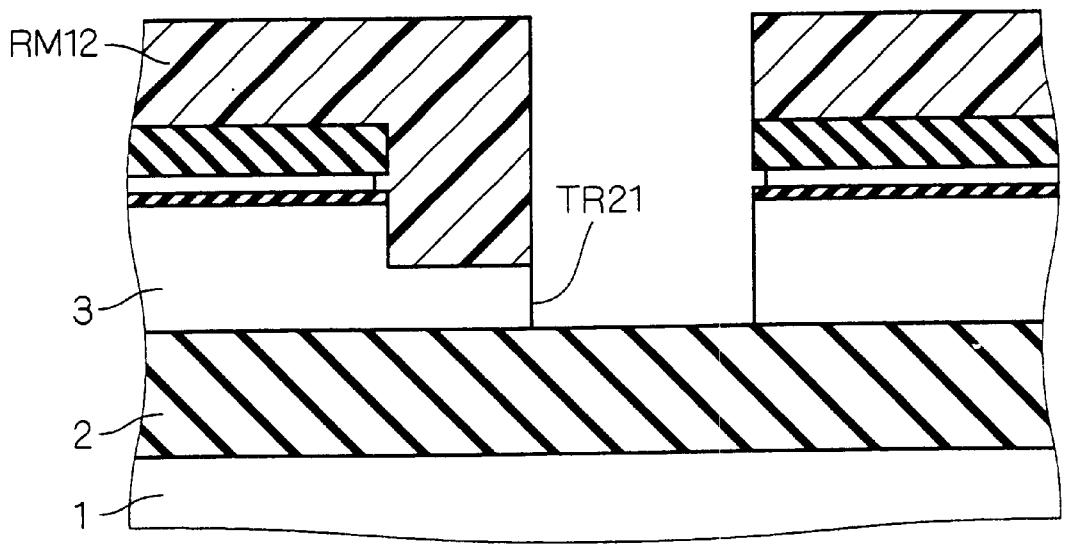

FIG. 14 shows the trench TR21 formed by etching the SOI layer 3 through the resist mask RM12. The right end surface of the polysilicon layer PS11 not covered with the resist mask RM12 further retreats.

Figure 15:
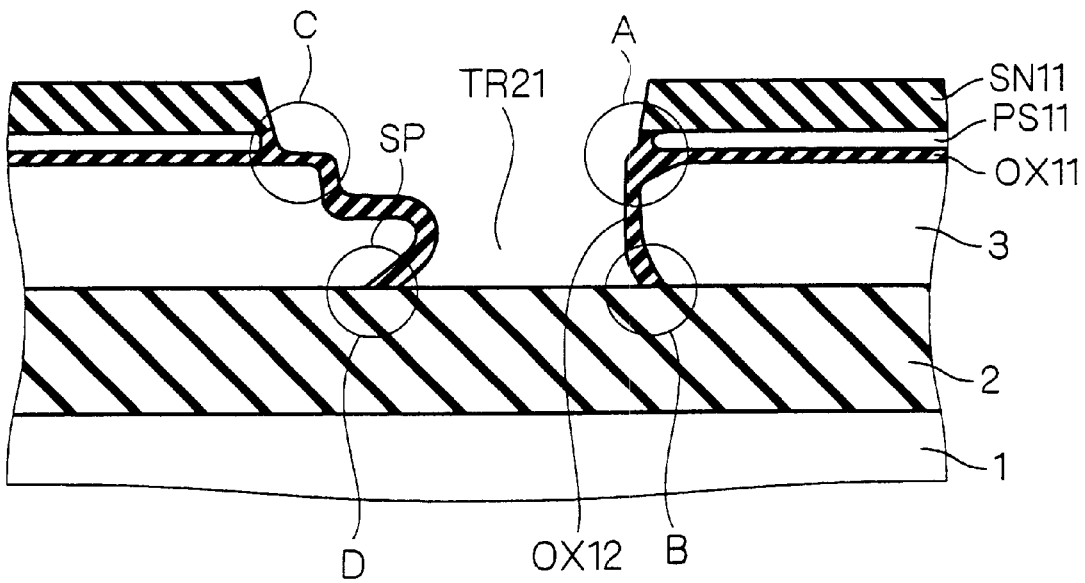

FIG. 15 shows the trench TR21 whose inner walls have been oxidized as shown in FIG. 6. As shown in FIG. 15, the end surface of the SOI layer 3 is thermally oxidized to change the oxide film OX12, while the degree of change thereof, i.e., the thickness of the oxide film OX12 is not necessarily uniform but different on the left and right side wall surfaces of the trench TR21.

In other words, the end surface of the polysilicon layer PS11 retreats as compared with the nitride film SN11 and the SOI layer 3 on the right side wall surface of the trench TR21 and hence oxygen serving as an oxidant deeply infiltrates into the clearances between the polysilicon layer PS11 and the oxide film OX11 and between the oxide film OX11 and the SOI layer 3 to consequently widen the oxidized regions of the polysilicon layer PS11 and the SOI layer 3 and increase the thickness of the oxide film OX12 in a portion (region A) close to the upper edge portion of the SOI layer 3 along the vertical direction (perpendicular to the substrate 10) and the horizontal direction (parallel to the substrate 10).

On the lower edge portion of the SOI layer 3, oxygen infiltrates into the interface between the SOI layer 3 and the buried oxide film 2 to widen the oxidized region of the SOI layer 3 and increase the horizontal and vertical thicknesses of the oxide film OX12 in a portion (region B) close to the lower edge portion of the SOI layer 3.

Also on the left side wall surface of the trench TR21, the end surface of the polysilicon layer PS11 retreats as compared with the nitride film SN11 and the SOI layer 3 to increase the vertical and horizontal thicknesses of the oxide film OX12 in a portion (region C) close to the upper edge portion of the SOI layer 3.

On the lower edge portion of the SOI layer 3, the thickness of the SOI layer 3 is smaller than that on the right side of the trench TR21 and hence an oxide film formed by oxygen infiltrating into the interface between the SOI layer 3 and the buried oxide film 2 readily grows to increase the horizontal and vertical thicknesses of the oxide film OX12 in a portion (region D) close to the lower edge portion beyond that on the right side wall surface of the trench TR21.

Figure 16:
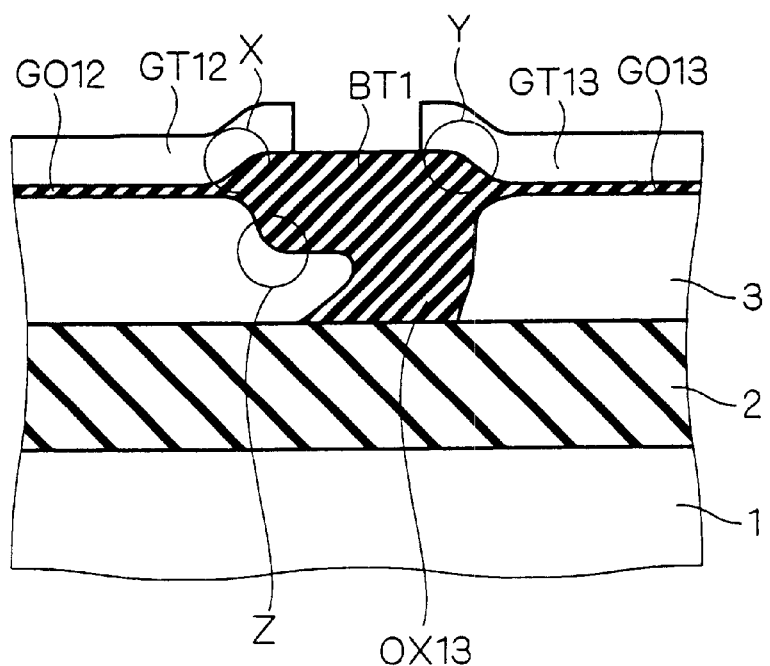
FIG. 16 is a sectional view showing the details of the structure of the semiconductor device according to the embodiment 1 of the present invention.

FIG. 16 shows the details of the sectional shape of the combined isolation oxide film BT1 formed by filling up the trench TR21 with the oxide film 13 whose inner walls are covered with the oxide film OX12 having the aforementioned shape, planarizing the same, thereafter removing the polysilicon layer PS11, the nitride film SN11 and the oxide film OX11 and forming the gate oxide films GO12 and GO13.

As shown in FIG. 16, edge portions of the combined isolation oxide film BT1 are in the form of bird's beaks in a LOCOS (local oxide of silicon) isolation oxide film. This is an effect resulting from the increase of the vertical and horizontal thicknesses of the oxide film OX12 in the portions close to the upper edge portion of the SOI layer 3 as shown in FIG. 15.

Consequently, portions defining the edge portions of the gate oxide films GO12 and GO13 are locally increased in thickness.

<A-3. Function/Effect>

Thus, the edge portions of the combined isolation oxide film BT1 are in the form of bird's beaks to consequently increase only the thicknesses of the edge portions of the gate oxide films GO12 and GO13.

In general, a gate oxide film is readily broken in the vicinity of an edge portion where an electric field tends to concentrate, and hence the gate oxide films GO12 and GO13 shown in FIG. 16 can be prevented from dielectric breakdown by increasing the thicknesses of the edge portions thereof.

Only the thicknesses of the edge portions of the gate oxide films GO12 and GO13 are increased and hence the transistor characteristics are not deteriorated dissimilarly to the case of increasing the thicknesses of the overall gate oxide films GO12 and GO13. Further, only the step of forming the oxide film OX12 is required for increasing the thicknesses of the gate oxide films GO12 and GO13 in particular, and hence increase of the manufacturing cost resulting from increase of the number of manufacturing steps can be minimized.

Oxygen infiltrates into the interface between the SOI layer 3 and the buried oxide film 2 for forming the oxide film OX12 on this interface in the vicinity of the lower edge portion of the SOI layer 3, whereby the interfacial state between the SOI layer 3 and the buried oxide film 2 can be improved.

In the combined isolation oxide film BT1, the shapes of the bird's beaks formed on the edge portions are slightly different from each other on the sides of the gate oxide films GO12 and GO13. This is because the wall surface closer to the gate oxide film GO12 is covered with the resist mask RM12 to define the form of a partial isolation oxide film when re-etching the trench TR2 while the wall surface closer to the gate oxide film GO13 is exposed to re-etching to define the form of a full isolation oxide film and hence the shapes of the left and right wall surfaces of the polysilicon layer PS11 differ from each other.

In conventional LOCOS isolation or the like, an isolation oxide film is formed by oxidizing a silicon layer and hence left and right edge portions of the isolation oxide film are identically shaped. In the inventive combined isolation oxide film BT1 formed by combining a full isolation oxide film and a partial isolation oxide film, on the other hand, the left and right shapes can be different from each other due to the aforementioned mechanism, and hence the shapes of the left and right edge portions of the isolation oxide film BT1 can be optimized in response to MOS transistors having different specs.

While upper inclined portions (first inclined portions) on regions X and Y of the edge portions of the combined isolation oxide film BT1 shown in FIG. 16 have loosely inclined contour shapes, an unnecessary gate material can be prevented from remaining on the surface of the combined isolation oxide film BT when removing the unnecessary gate material in gate shaping due to such contour shapes.

On the other hand, a lower inclined portion (second inclined portion) on a region Z has an elliptic contour shape roundedly projecting toward the SOI layer 3, whereby stress caused in the vicinity of the interface between the SOI layer 3 and the isolation oxide film BT1 due to heat treatment or oxidation performed in the process of manufacturing the semiconductor device can be relaxed for inhibiting the SOI layer 3 from crystal defects caused by such stress.

While the length of a step portion SP on the left side surface of the SOI layer 3 is not much large as compared with the height thereof in the trench TR21 shown in FIG. 15, stress lifting up its forward end portion may be applied due to formation of the oxide film OX12 when the length of the step portion SP is increased to reduce structural strength, to result in partial formation of crystal defects.

Figure 17:
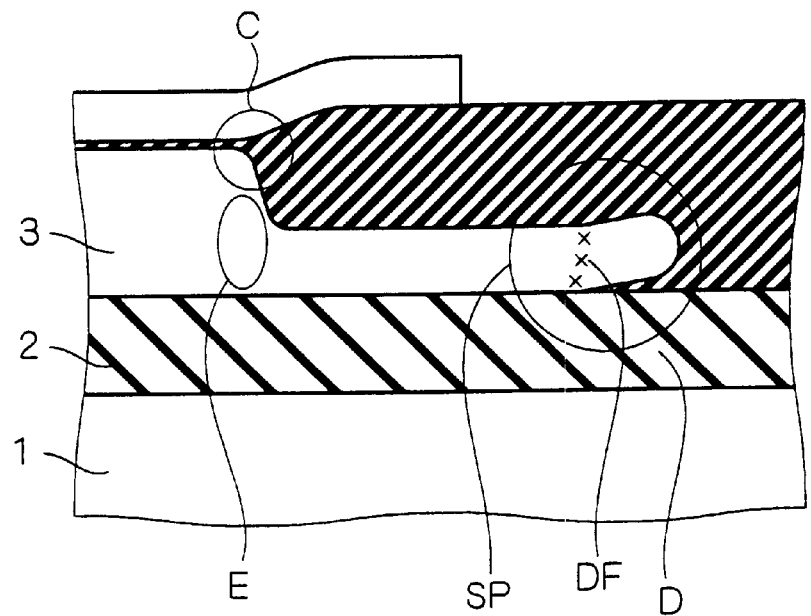
FIG. 17 is a sectional view showing the function/effect of the semiconductor device according to the embodiment 1 of the present invention.

FIG. 17 typically shows this state. As shown in FIG. 17, the forward end of the step portion SP of the SOI layer 3 is lifted up to cause crystal defects DF by such stress. However, a portion shown by symbol D does not directly influence the transistor characteristics and no problem is caused by the crystal defects DF resulting from the stress increased on this portion. The crystal defects DF may contrarily serve as gettering sites for contaminous impurities.

When the length of the step portion SP is increased to separate the regions C and D from each other, increase of an electric field on an element end portion can be suppressed. An electric field of a gate electrode may pass through the isolation oxide film BT1 and the buried oxide film 2 to cause potential rise on the side surface of the SOI layer 3 or the inner portion close to the side surface to raise the electric field on the element end portion in a region E shown in FIG. 17. When the length of the step portion SP is increased, the electric field is inhibited from entering the inner portion of the SOI layer 3 close to the side surface. Thus, increase of the electric field on the element end portion on the region E can be suppressed for contributing to improvement of the transistor characteristics.

<A-4. Modification>

While the combined isolation oxide film BT1 is formed by combining a full isolation oxide film and a partial isolation oxide film as described above and presents shapes of bird's beaks on the end portions thereof, a further effect can be attained by optimizing the shapes of the edge portions.

Figure 18:
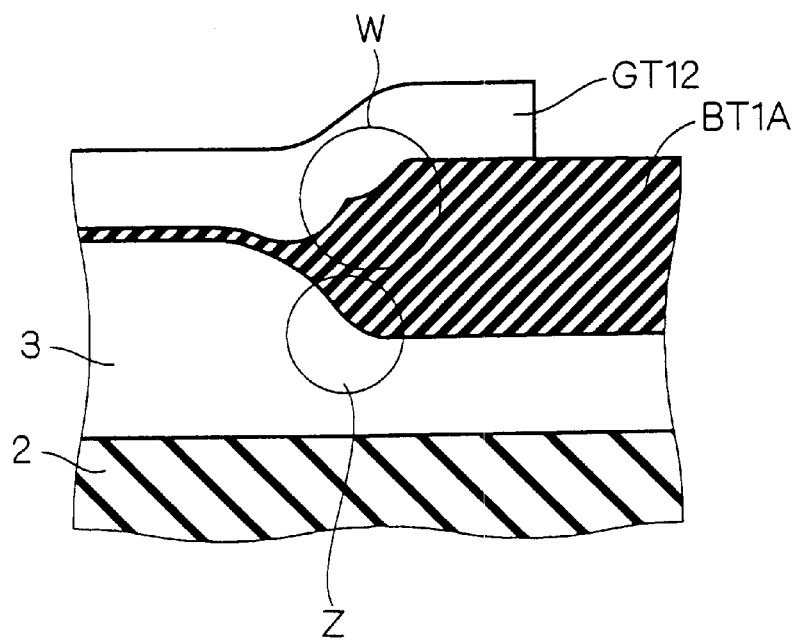
FIG. 18 is a sectional view showing the structure of a modification of the semiconductor device according to the embodiment 1 of the present invention.

FIG. 18 is a partially fragmented sectional view showing a combined isolation oxide film BT1A in which the shape of each edge portion is optimized. FIG. 18 shows the structure of the combined isolation oxide film BT1A on the side of a gate electrode GT12. In an upper inclined portion (first inclined portion) shown as a region Z, the contour of the combined isolation oxide film BT1A has two continuous depressions.

Due to this shape, an effect of preventing an unnecessary gate material from remaining on the surface is increased in gate shaping while a step projecting from the main surface of an SOI layer 3 can be reduced by reducing the thickness of the edge portion of the combined isolation oxide film BT1A, whereby a step of forming the gate electrode GT12 or the like is simplified.

On the other hand, a lower inclined portion (second inclined portion) shown as a region W in FIG. 18 has a shape roundedly projecting toward the SOI layer 3 and hence stress caused in the vicinity of the interface between the SOI layer 3 and the isolation oxide film BT1A caused by heat treatment or oxidation performed in the process of manufacturing a semiconductor device can be relaxed and the SOI layer 3 can be inhibited from causing crystal defects by such stress.

A method of manufacturing the combined isolation oxide film BT1A is now described with reference to FIGS. 19 to 22.

Figure 19:
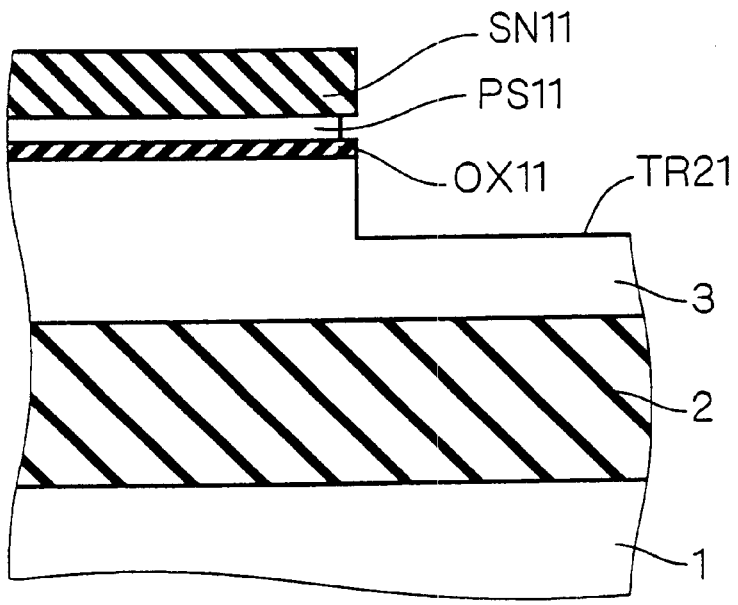
FIGS. 19 to 22 are sectional views illustrating steps of manufacturing the modification of the semiconductor device according to the embodiment 1 of the present invention.

FIG. 19 shows part of a trench TR21 formed identically to the trench TR21 described with reference to FIG. 14. Elements identical to those in FIG. 14 are denoted by the same reference numerals.

Figure 20:
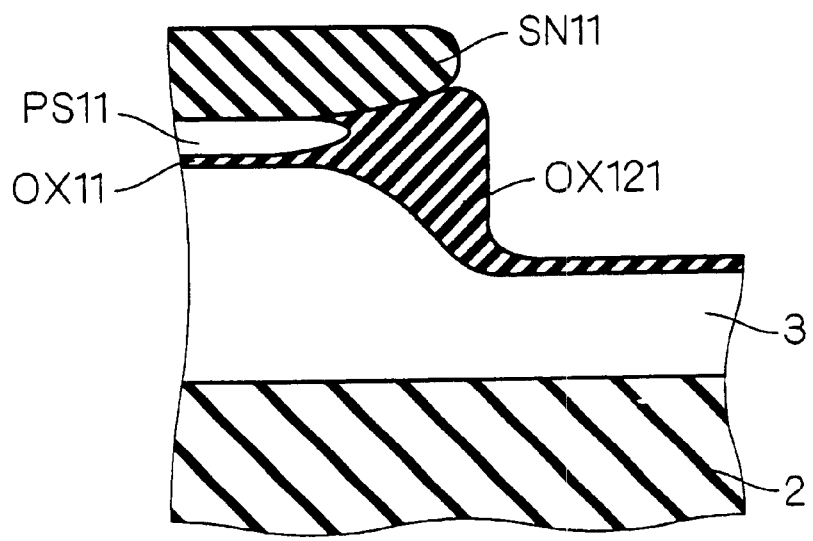

In a step shown in FIG. 20, an oxide film OX121 is formed on the inner wall of the trench TR21. While the oxide film OX12 shown in FIG. 15 is formed by thermal oxidation at a temperature of about 800 to 1350° C., the oxide film OX121 is formed by wet oxidation under a temperature condition of about 700 to 900° C. or oxidation in an atmosphere containing HCl (hydrochloric acid) and oxygen. Thus, the oxide film OX121 more deeply infiltrates into clearances between a polysilicon layer PS11 and an oxide film OX11 and between the oxide film OX11 and the SOI layer 3, to render the shape of a bird's beak more remarkable.

Figure 21:
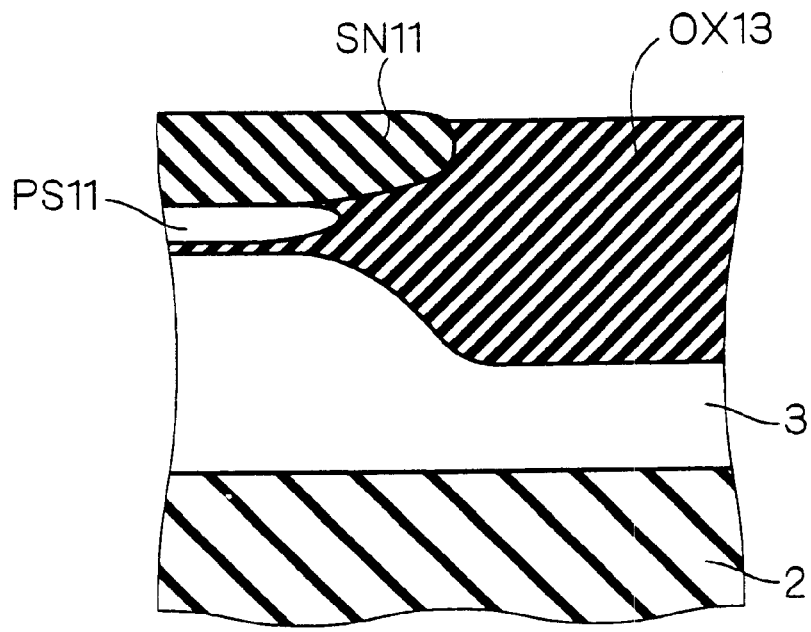

Then, the trench TR21 is filled up with an oxide film OX13, which in turn is planarized by CMP for obtaining a structure shown in FIG. 21. The quantity of the oxide film OX13 polished by CMP is reduced by about 10 to 500 nm as compared with that in the step described with reference to FIG. 9 for leaving the oxide film OX13 so that the position of the planarized surface of the oxide film OX13 is not excessively lowered beyond the main surface of a nitride film SN11, in order to prevent overetching in subsequent etching set to a long treatment time.

Figure 22:
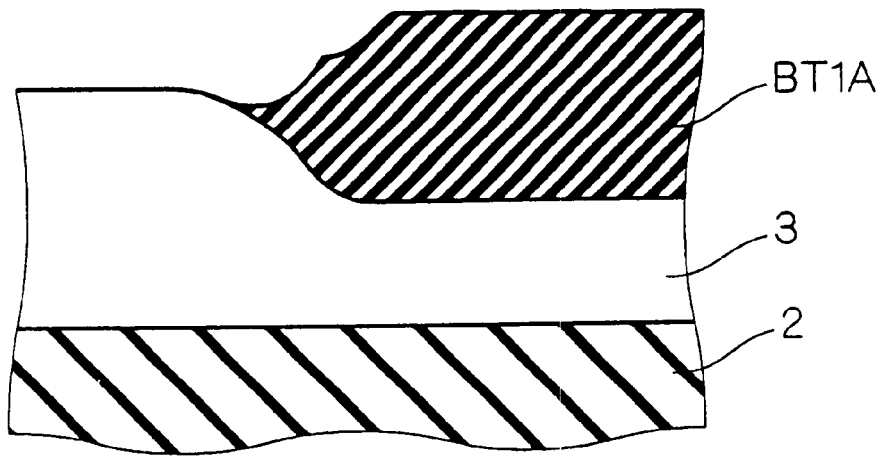

In a step shown in FIG. 22, the nitride film SN11 and the polysilicon layer PS11 are removed by wet etching followed by removal of the oxide film OX11. At this time, the etching conditions are overly set by 50 to 100% thereby smoothing the contour shape of the bird's beak of the oxide film OX13 while forming depressions in the contour of the oxide film OX13 in correspondence to the contour shapes of the nitride film SN11 and the polysilicon layer PS11 thereby obtaining the combined isolation oxide film BT1A.

Figure 23:
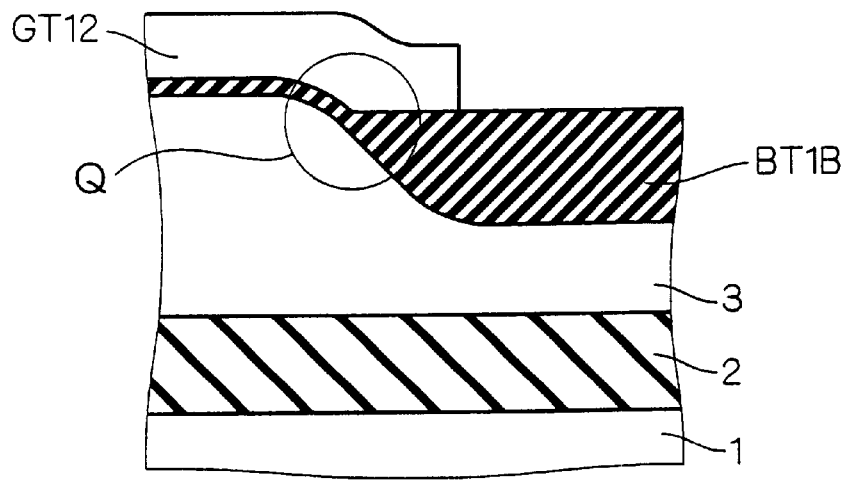
FIG. 23 is a sectional view illustrating a structure obtained by overetching.

When the oxide film OX13 is so excessively etched that the upper surface of the full isolation oxide film lowers below the main surface of the SOI layer 3, the following problem arises:

FIG. 23 shows a combined isolation oxide film BT1B so formed that its upper surface is located on a position lower than the main surface of an SOI layer 3.

Since the upper surface of the combined isolation oxide film BT1B is lower than the main surface of the SOI layer 3, an edge portion of a gate electrode GT12 is depressed toward the SOI layer 3 and the gate electrode GT12 twines around a corner portion of the SOI layer 3.

Consequently, an electric field concentrates to a region Q to disadvantageously cause dielectric breakdown of a gate oxide film. When the electric field concentrates on the region Q, it follows that a subthreshold characteristic of a MOS transistor has a hump.

Figure 24:
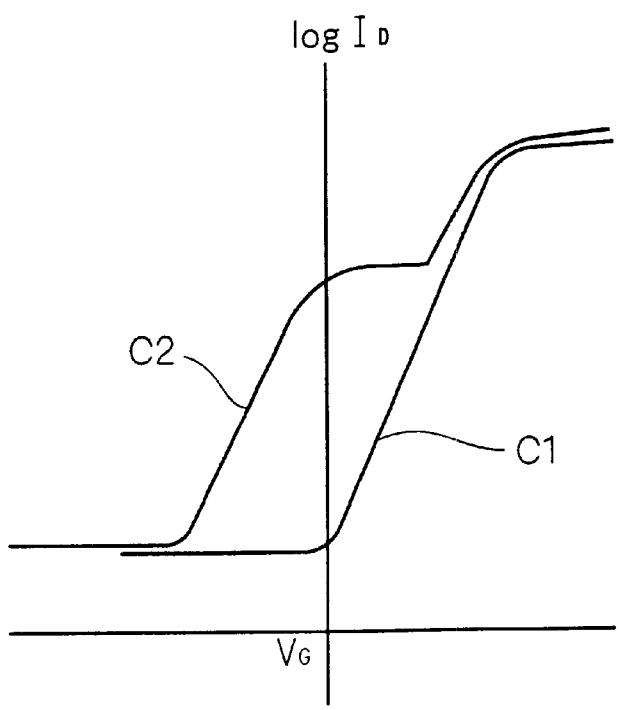
FIG. 24 is a diagram illustrating a problem caused by overetching.

FIG. 24 shows an ideal subthreshold characteristic C1 and a subthreshold characteristic C2 having a hump. Referring to FIG. 24 showing a gate voltage $V_G$ on the horizontal axis and a drain current $I_D$ on the vertical axis, the drain current $I_D$ exponentially increases as the gate voltage $V_G$ increases in the ideal subthreshold characteristic C1, while the subthreshold characteristic C2 having a hump includes a region where the drain current $I_D$ does not increase despite increase of the gate voltage $V_G$. The presence of such a hump disadvantageously lowers the threshold voltage of a parasitic transistor to readily turn on the parasitic transistor, and hence it is important to prevent the oxide film OX13 from overetching.

<B. Embodiment 2>
<B-1. Device Structure>

In the aforementioned embodiment 1, the edge portions of the combined isolation oxide film BT1 shown in FIG. 16 are in the form of bird's beaks to consequently increase the thicknesses of the edge portions of the gate oxide films GO12 and GO13. The shapes of the bird's beaks are only slightly different from each other on the left and right edge portions, while the shapes of edge portions can be rendered clearly different from each other.

Figure 25:
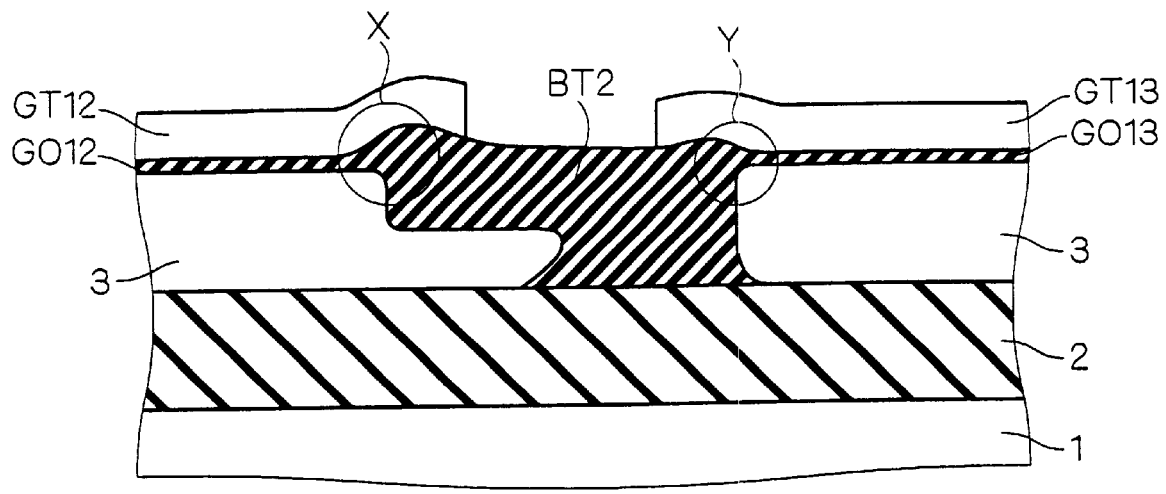
FIG. 25 is a sectional view illustrating the structure of a semiconductor device according to an embodiment 2 of the present invention.

FIG. 25 shows a sectional structure of a combined isolation oxide film BT2 having clearly different shapes of edge portions. Referring to FIG. 25, elements identical to those shown in FIG. 16 are denoted by the same reference numerals.

As shown in FIG. 25, thicknesses are different from each other on a left edge portion (closer to a gate electrode GT12) shown as a region X and a right edge portion (closer to a gate electrode GT13) shown as a region Y. In other words, a protrusion of a portion of the right edge portion corresponding to the edge portion the gate oxide film GO13 is lower as compared with a protrusion of a portion of the left edge portion corresponding to the edge portion of the gate oxide film GO12, and the thicknesses of the edge portions of the gate oxide films GO12 and GO13 are consequently different from each other.

<B-2. Function/Effect>

Thus, gate oxide films having different thicknesses of edge portions can be formed by increasing the thickness of an edge portion of a full isolation oxide film beyond that of another edge portion, to attain a structure suitably formed between a MOS transistor in which reliability of a gate oxide film is to be improved and a MOS transistor whose transistor characteristics are set with the characteristics of a parasitic transistor rather than reliability of a gate oxide film.

When controlling transistor characteristics with the threshold voltage of a parasitic transistor, the thickness of an edge portion of a gate oxide film is rather reduced since it is undesirable that field concentration is suppressed due to a large thickness on the edge portion of the gate oxide film to increase the threshold voltage of the parasitic transistor. In this case, a structure such as that of the combined isolation oxide film BT2 is effective.

<B-3. Manufacturing Method>

A method of manufacturing the combined isolation oxide film BT2 is now described with reference to FIGS. 26 to 31. The following description also shows an example changing the procedure of the step of thermally oxidizing the inner wall of the trench described with reference to the embodiment 1.

Figure 26:
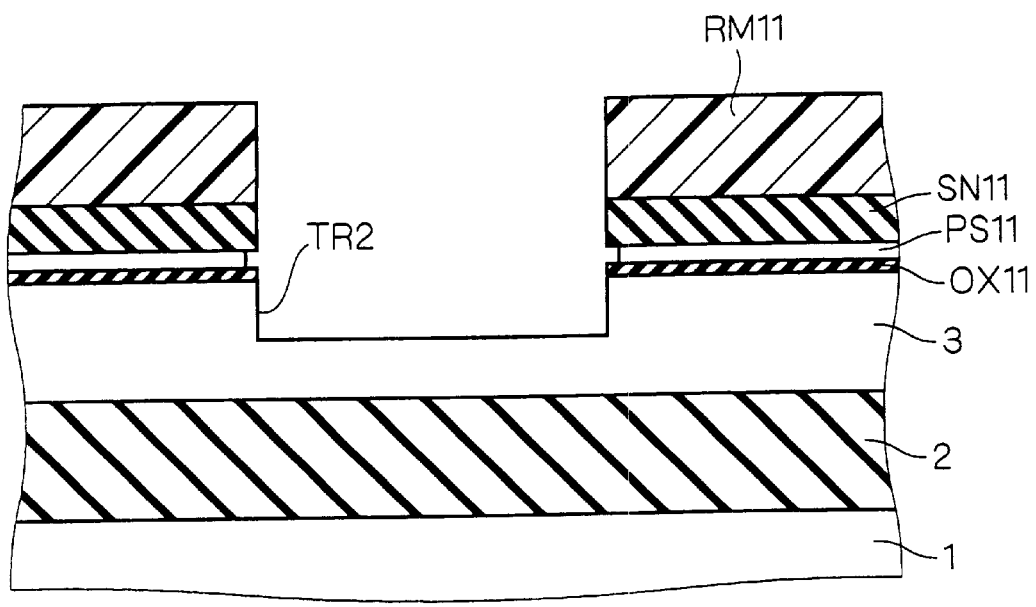

As shown in FIG. 26, a nitride film SN11 is etched in response to an opening pattern of a resist mask RM11 and thereafter employed as an etching mask for etching a polysilicon layer PS11, an oxide film OX11 and an SOI layer 3 and forming trenches TR1, TR2 and TR3 in correspondence to positions for forming partial isolation oxide films PT1 and PT2 and a combined isolation oxide film BT1. A step preceding that shown in FIG. 26 is identical to that for the combined isolation oxide film BT1 according to the embodiment 1 described with reference to FIG. 3. FIG. 26 shows the portion of the trench TR2 in a step identical to that for the trenches TR1 to TR3 described with reference to FIG. 4, and elements identical to those in FIG. 4 are denoted by the same reference numerals.

Figure 27:
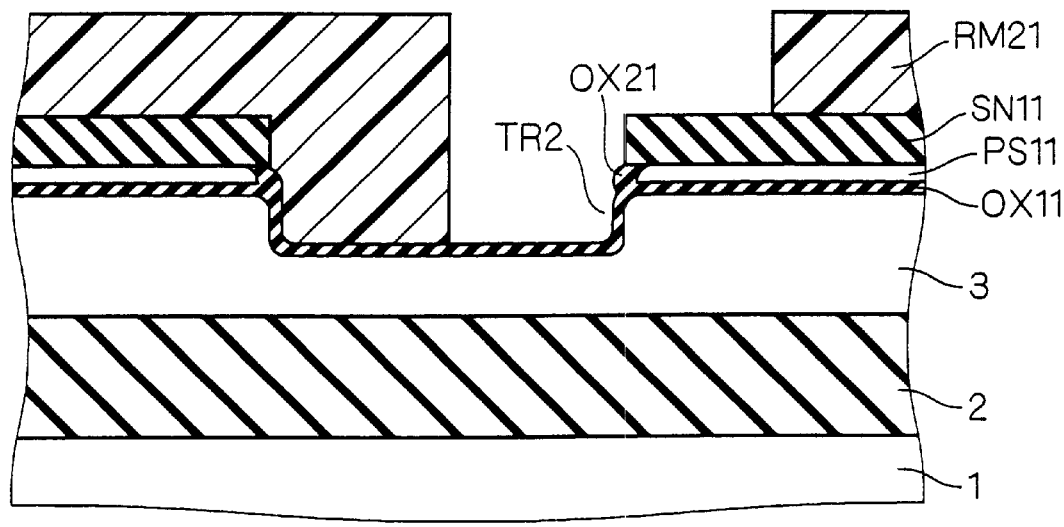

In a step shown in FIG. 27, the surface of the SOI layer 3 exposed in the trench TR2 is thermally oxidized through the nitride film SN11 serving as a mask for forming an oxide film OX21. While an end surface of the SOI layer 3 is thermally oxidized to turn into the oxide film OX21, the degree of change thereof, i.e., the thickness of the oxide film OX21 is ununiform for a reason similar to that for the oxide film OX21 described with reference to FIG. 15. On the left and right side wall surfaces of the trench TR2, the end surfaces of the polysilicon layer PS11 retreat as compared with the nitride film SN11 and the SOI layer 3 to increase the vertical and horizontal thicknesses of the oxide film OX21 in the vicinity of the upper edge portion of the SOI layer 3. However, the thicknesses are substantially identical to each other on the left and right side wall surfaces. This is because the left and right side surfaces of the polysilicon layer PS11 are merely exposed to single etching at this point of time and hence the amounts of retreat of the end surfaces of the polysilicon layer PS11 are equivalent to each other. This also applies to the case where not only the end surfaces of the polysilicon layer PS11 but also those of the nitride film SN11 retreat.

Then, a resist mask RM21 is formed by patterning. The resist mask RM21 has a pattern for opening a prescribed portion of the trench TR2 and part of the nitride film SN11 on the right side of the trench TR2. More specifically, the resist mask RM21 has such a pattern that a region corresponding to a portion of the combined isolation oxide film BT2 (FIG. 25) formed later reaching a buried oxide film 2 through the SOI layer 3 to a portion on the nitride film SN11 corresponding to the region Y are opened. The trench TR2 is etched in response to the opening pattern of the resist mask RM21 for exposing the buried oxide film 2, for turning the trench TR2 into a trench TR21 having a portion passing through the SOI layer 3 as shown in FIG. 28.

Figure 28:
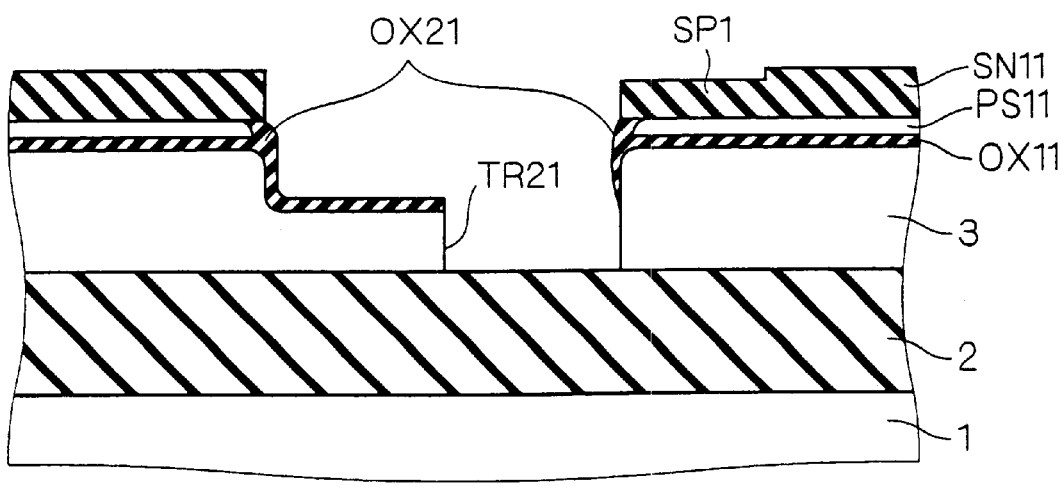

Referring to FIG. 28, the portion of the oxide film OX21 located on the left side wall of the trench TR2 has small shape change since the same has been protected by the resist mask RM21, while the shape of the portion of the oxide film OX21 located on the right side wall surface is changed by etching. A portion of the nitride film SN11 located on the right side of the trench TR21 is etched to define a step portion SP1.

Figure 29:
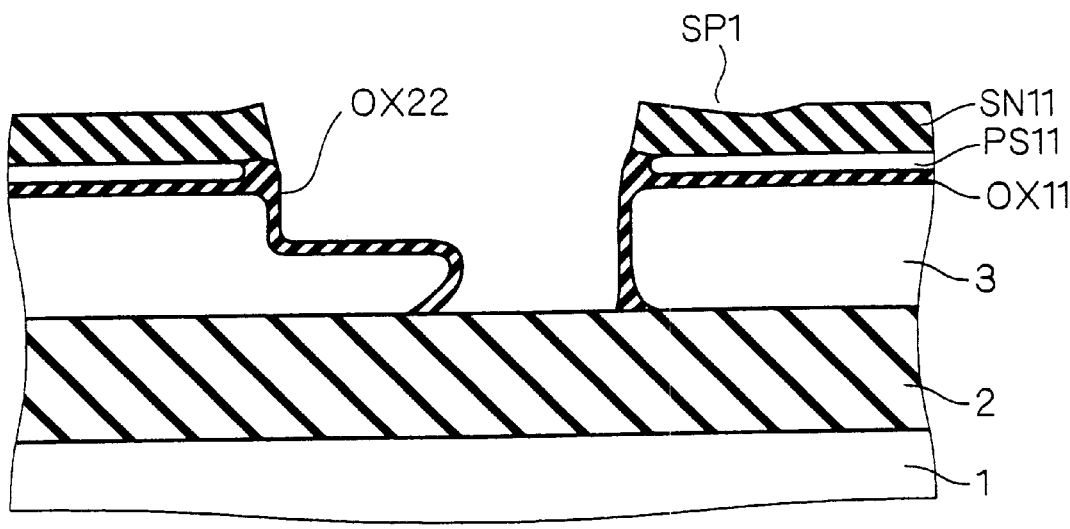

In a step shown in FIG. 29, the inner wall of the trench TR21 is further thermally oxidized to increase the thickness of the oxide film OX21 while the exposed surface of the SOI layer 3 is oxidized for forming an oxide film OX22.

In the oxide film OX22, the vertical and horizontal thicknesses in the vicinity of the upper end portion of the SOI layer 3 are further increased as compared with the oxide film OX21, while the vertical and horizontal thicknesses are increased also on the lower edge portion of the SOI layer 3 similarly to the oxide film OX12 described with reference to FIG. 15.

Figure 30:
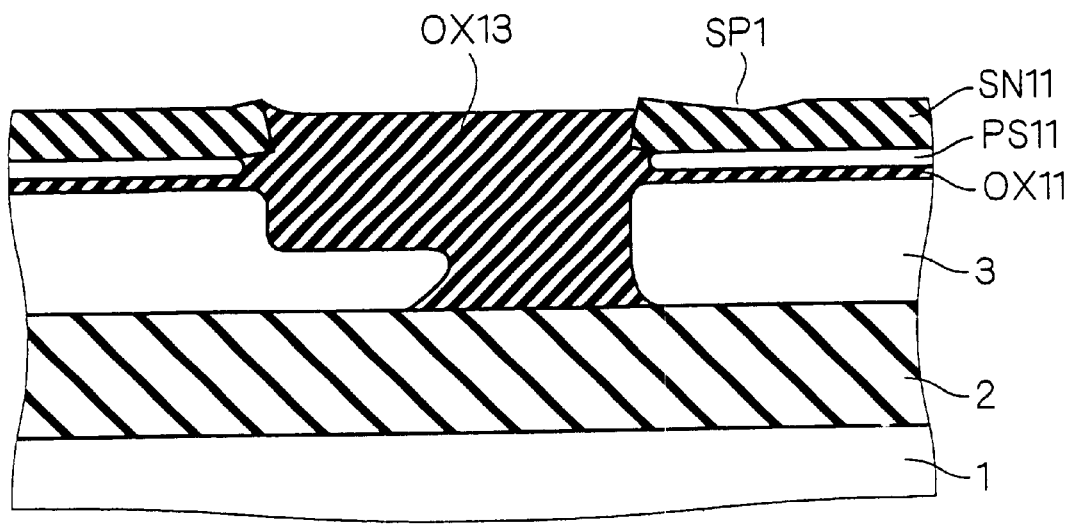

The trench TR21 whose inner surface is covered with the oxide film OX22 having the aforementioned shape is filled up with an oxide film OX13 and planarized by CMP, as shown in FIG. 30.

Referring to FIG. 30, the thickness of the right end portion of the nitride film SN11 having the step portion SP1 is reduced as compared with the left end portion, so that the thicknesses of the left and right portions of the planarized oxide film OX13 are different from each other.

Since the nitride film SN11 is employed as a stopper in the planarizing by CMP, the portion of the oxide film OX13 closer to the right end portion reduced with the step portion SP1 is polished in a larger quantity as compared with the portion of the oxide film OX13 closer to the left end portion, and it follows that the thicknesses of the planarized oxide film OX13 are consequently different from each other.

Then, the polysilicon layer PS11, the nitride film SN11 and the oxide film OX11 are removed, thereby obtaining the sectional shape of the combined isolation oxide film BT2 shown in FIG. 31.

The difference between the left and right thicknesses of the planarized oxide film OX13 remains also after removing the polysilicon layer PS11, the nitride film SN11 and the oxide film OX11 by etching.

Thus, the thickness of one edge portion of the full isolation oxide film can be increased beyond that of the other edge portion by rendering the left and right thicknesses of the opening of the nitride film employed as a stopper for CMP different from each other for providing difference between the left and right thicknesses of the planarized oxide film.

<B-4. Modification>

While the thickness of one end portion of the nitride film employed as the stopper for CMP is previously reduced in the above description, the thickness of one end portion of a nitride film can also be reduced by a method described with reference to FIGS. 32 to 38.

FIG. 32 illustrates a step identical to that described with reference to FIG. 27, and elements identical to those in FIG. 27 are denoted by the same reference numerals.

The step shown in FIG. 32 is different from that shown in FIG. 27 only in a point that the resist mask RM21 is replaced with a resist mask RM31 having an opening OP11 also in the vicinity of an edge portion of a nitride film SN11 located on the left side of a trench TR2. The opening OP11 is arranged along the direction of extension of the trench TR2.

Figure 33:
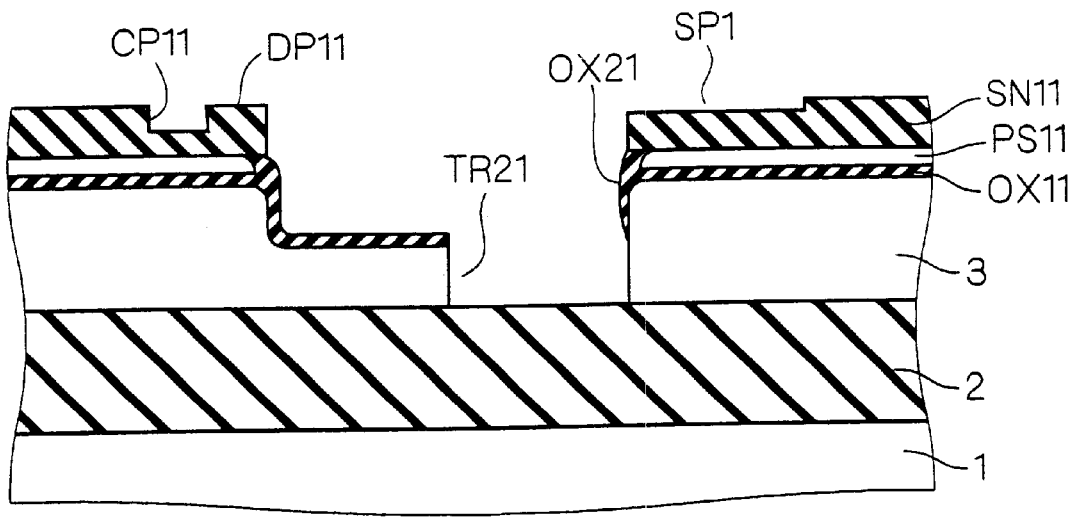

The trench TR2 is etched in response to the opening pattern of the resist mask RM31 for exposing a buried oxide film 2 and forming a trench TR21, as shown in FIG. 33.

FIG. 33 corresponding to the structure shown in FIG. 28 is different from FIG. 28 only in a point that a concave portion CP11 is formed on the nitride film SN11 in correspondence to the opening OP11 of the resist mask RM31.

Figure 34:
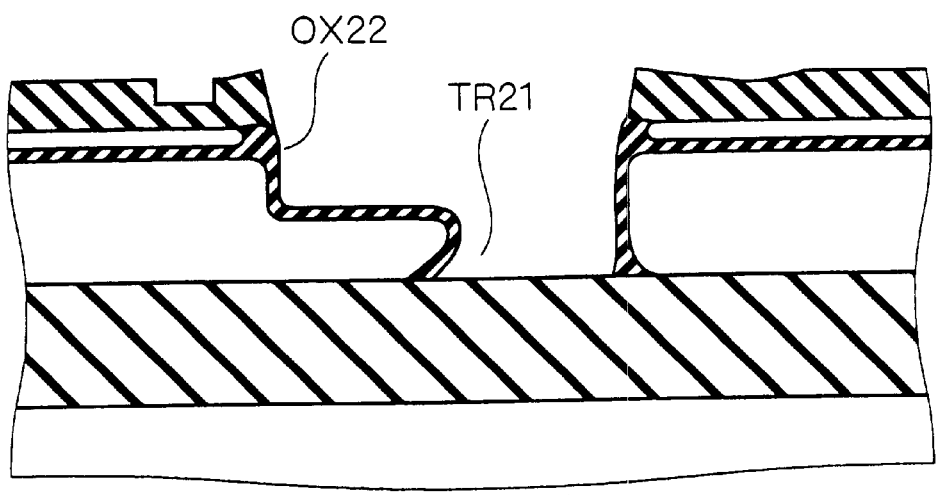

In a step shown in FIG. 34, the inner wall of the trench TR21 is further thermally oxidized to increase the thickness of the oxide film OX21, while the exposed surface of the SOI layer 3 is oxidized to form an oxide film OX22.

Figure 35:
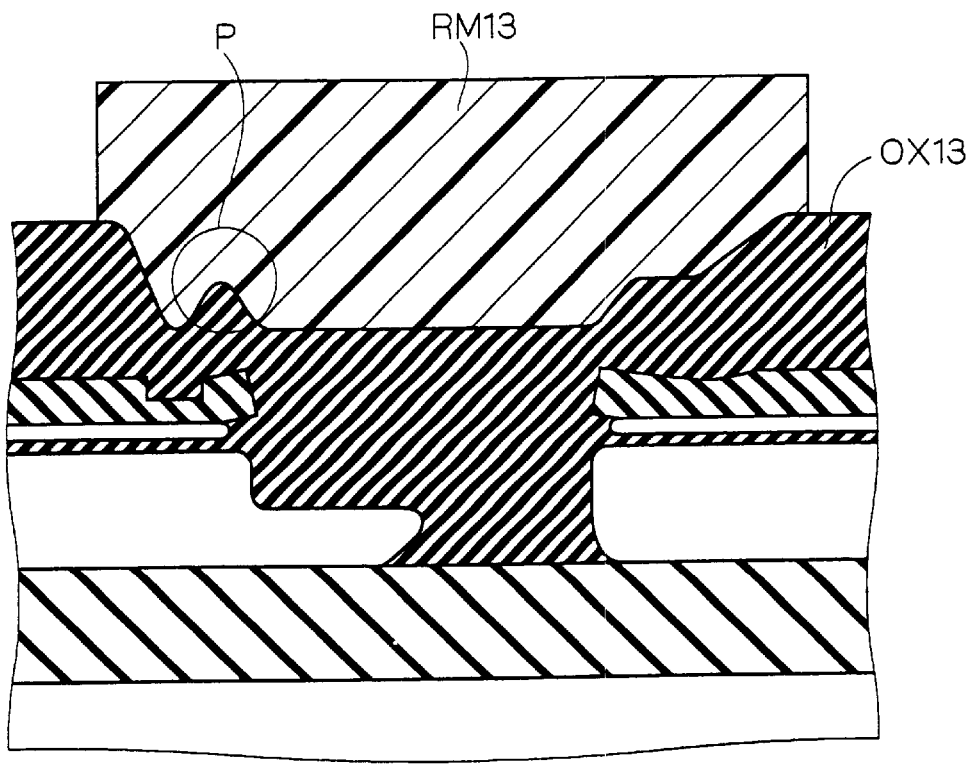

In a step shown in FIG. 35, the trench TR21 whose inner surface is covered with the oxide film OX22 is filled up with an oxide film OX13.

As described above, the oxide film OX13 is formed by HDP (high density plasma)-CVD. Film formation by HDP-CVD is characterized in that large difference is caused between the thicknesses of a film formed on a flat wide plane surface and a film formed on a narrow irregular plane surface.

As shown in FIG. 35, a protrusion DP on the edge portion of the nitride film SN11 defined by a concave portion CP11 has a narrow area while the thickness of the oxide film OX13 in a region P formed thereon is smaller than that of the portion of the oxide film OX13 formed on the nitride film SN11 outside the concave portion CP11 (opposite to the trench TR21).

Referring to FIG. 35, the resist mask RM13 patterned to cover an irregular portion reflecting the step shape of the trench TR21 as described with reference to FIG. 7 is formed on the oxide film OX13, and this resist mask RM13 is arranged to cover the region P of the oxide film OX13.

Figure 36:
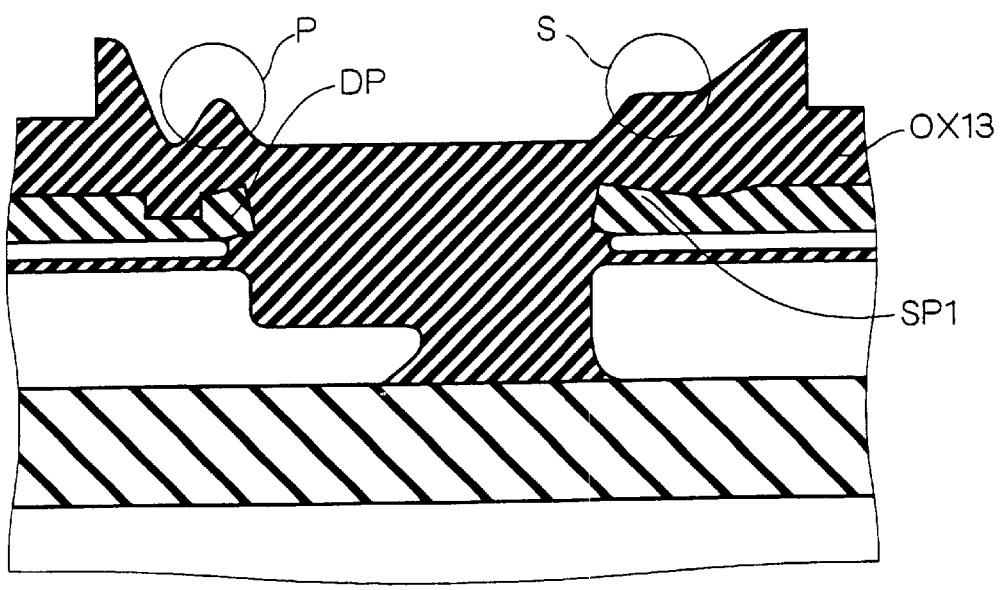

The oxide film OX13 is etched to a prescribed depth in response to the opening pattern of the resist mask RM13, which in turn is removed as shown in FIG. 36. Referring to FIG. 36, the thickness of a region S of the oxide film OX13 located on a step portion SP1 of the nitride film SN11 is substantially identical to the thickness of the region P of the oxide film OX13, and these regions S and P are identically polished when planarizing the oxide film OX13 by CMP in this state.

Figure 37:
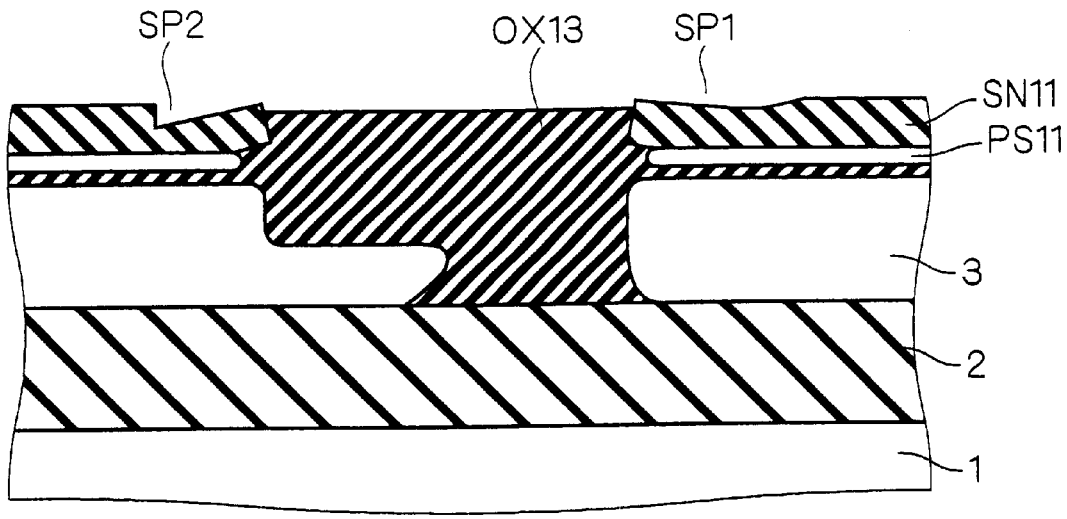

As shown in FIG. 37, the protrusion DP of the nitride film SN11 is also polished in the region P, and the concave portion CP11 disappears to define a step portion SP2.

Consequently, the left and right thicknesses of the planarized oxide film OX13 are uniformalized in the vicinity of the left and right end portions of the nitride film SN11.

Figure 38:
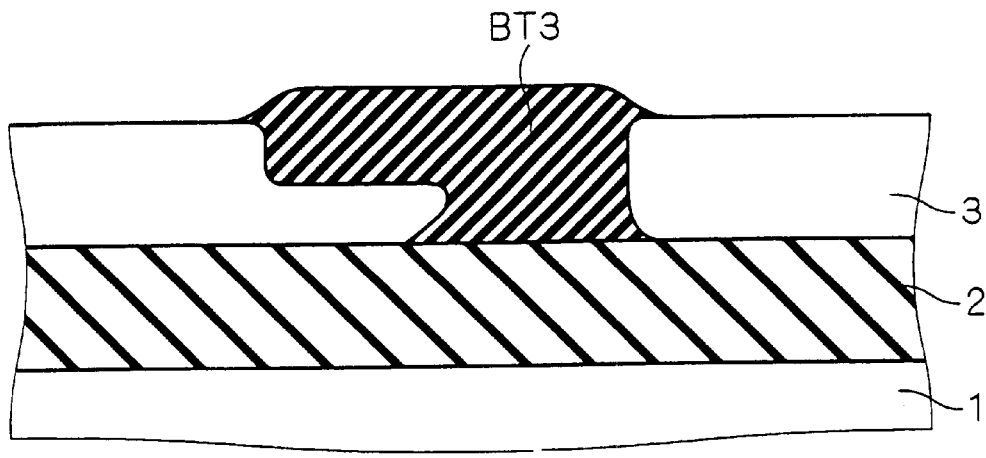

Then, the polysilicon layer PS11, the nitride film SN11 and the oxide film OX11 are removed for obtaining the sectional shape of a combined isolation oxide film BT3 shown in FIG. 38.

In the combined isolation oxide film BT3, the left and right edge portions have protrusions of equivalent heights and identical thicknesses.

The left and right thicknesses of the planarized oxide film OX13 are uniform and remain as such also after removing the polysilicon layer PS11, the nitride film SN11 and the oxide film OX11 by etching.

Thus, it follows that an effect similar to that attained by previously reducing the thickness of one end portion of the nitride film is attained by forming an irregular portion having a narrow area on an end portion of the nitride film employed as the stopper for CMP.

While trench etching is performed with an etching mask of the structure obtained by stacking the oxide film OX1, the polysilicon layer PS11 and the nitride film SN11 on the SOI layer 3 in each of the aforementioned embodiments 1 and 2 of the present invention, the polysilicon layer PS11 may not be used but the nitride film SN11 may be directly formed on the oxide film OX11. In this case, the bird's beaks are formed by thermally oxidizing the oxide film OX11.

While the shapes of the edge portions of the combined isolation oxide films BT1 to BT3 formed by combining full isolation oxide films and partial isolation oxide films are arbitrarily controlled in the embodiments 1 and 2, the full isolation oxide films and the partial isolation oxide films can also be similarly controlled, as a matter of course.

While the present invention is applied to the trench isolation oxide film serving as the isolation oxide film for MOS transistors formed on an SOI substrate in each of the embodiments 1 and 2, the present invention is not restricted to this but is also applicable to the case of employing a trench isolation oxide film as an isolation oxide film for MOS transistors formed on a bulk silicon substrate, as a matter of course.

<C. Further Function/Effect Common to Embodiments 1 and 2>

While such function/effect that the edge portions are in the form of bird's beaks to increase only the thicknesses of the edge portions of the gate oxide film as a result has been described with reference to the aforementioned embodiments 1 and 2, the following function/effect is additionally attained.

Figure 39:
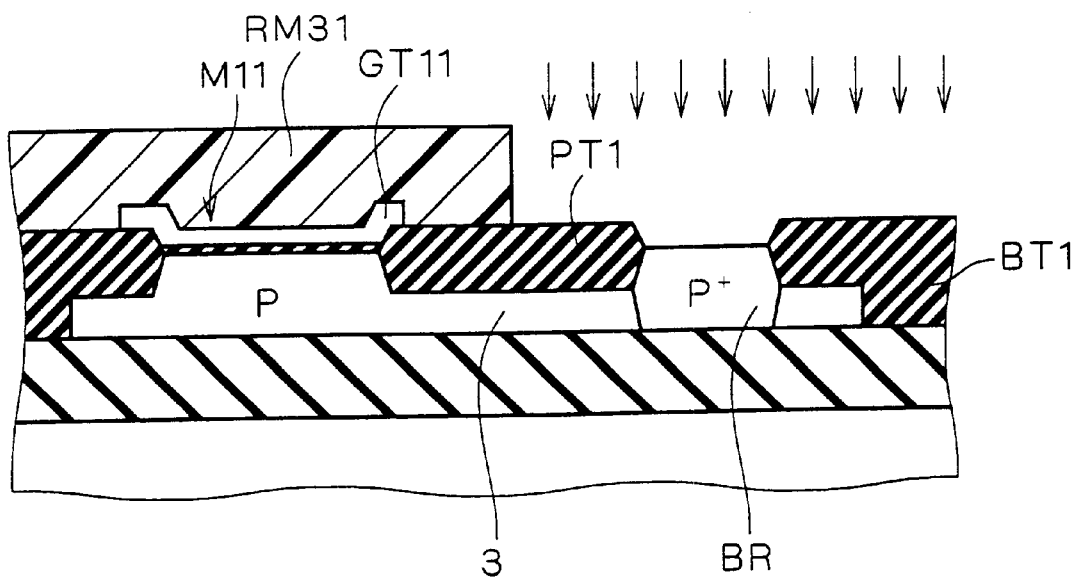
FIGS. 39 and 40 are sectional views illustrating further function/effect of the semiconductor devices according to the embodiments 1 and 2 of the present invention.

FIG. 39 shows a sectional structure taken along the line A-O-C in FIG. 2. Referring to FIG. 39, a body region BR of the region NR where the NMOS transistors M11 and M12 are arranged is a p-type impurity region of a relatively high concentration whose range is defined by the combined isolation oxide film BT1 and the partial isolation oxide film PT1. The body region BR is electrically connected to the channel region (p-type) of the NMOS transistor M11 (and M12) through the SOI layer 3 (p-type well region) located under the partial isolation oxide film PT1.

FIG. 39 shows a step of covering the NMOS transistor M11 (and M12) with the resist mask RM31 and implanting a p-type impurity into the body region BR and the source/drain layer of the PMOS transistor (not shown).

Figure 40:
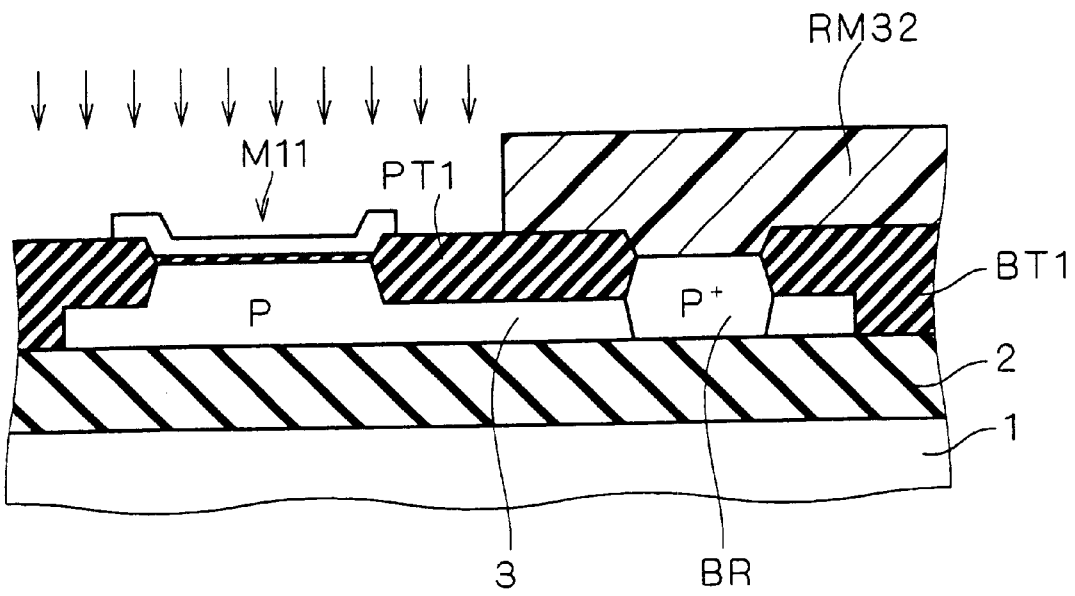
Figure 41:
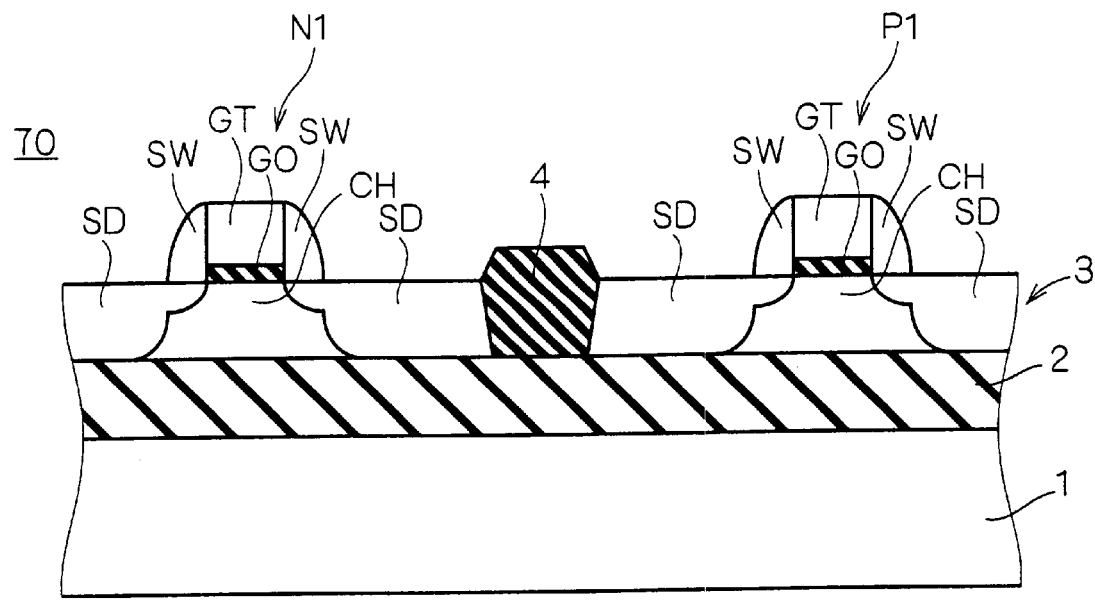
FIGS. 41 and 42 are sectional views illustrating the structures of conventional semiconductor devices.
Figure 42:
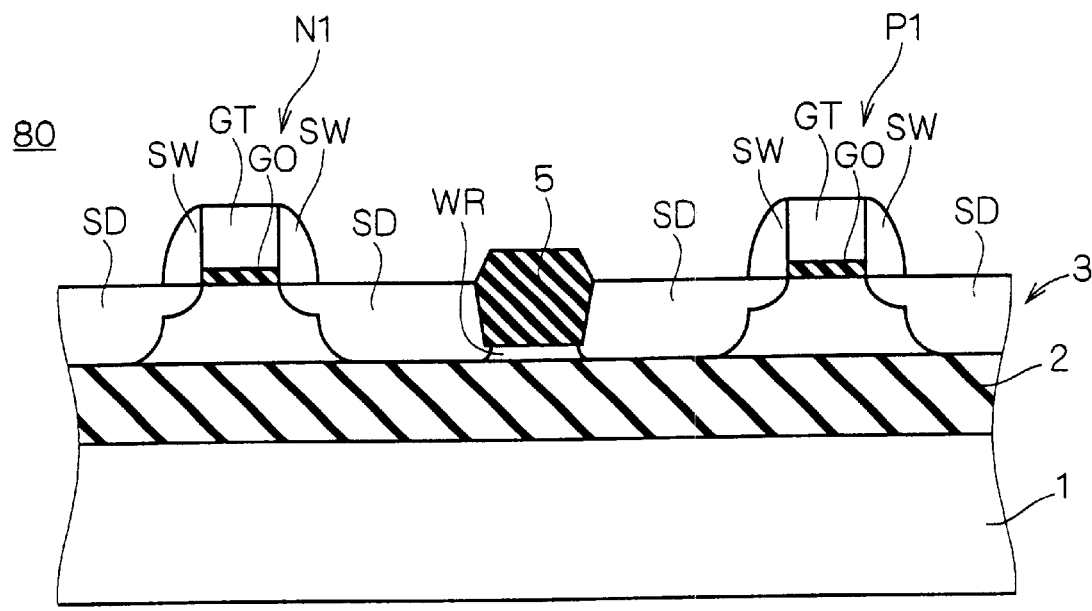
Figure 43:
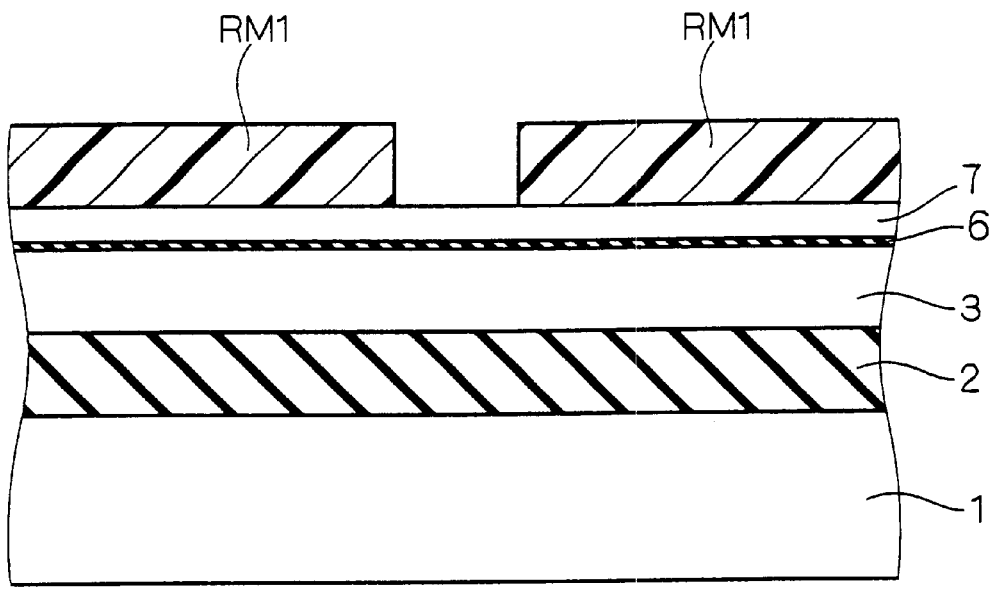
FIGS. 43 to 49 are sectional views illustrating steps of manufacturing a conventional semiconductor device.
Figure 44:
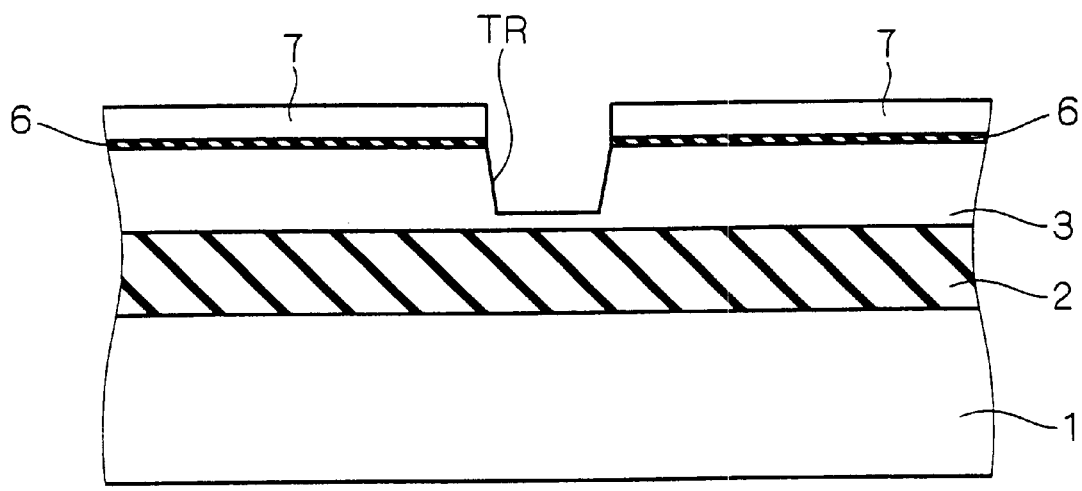
Figure 45:
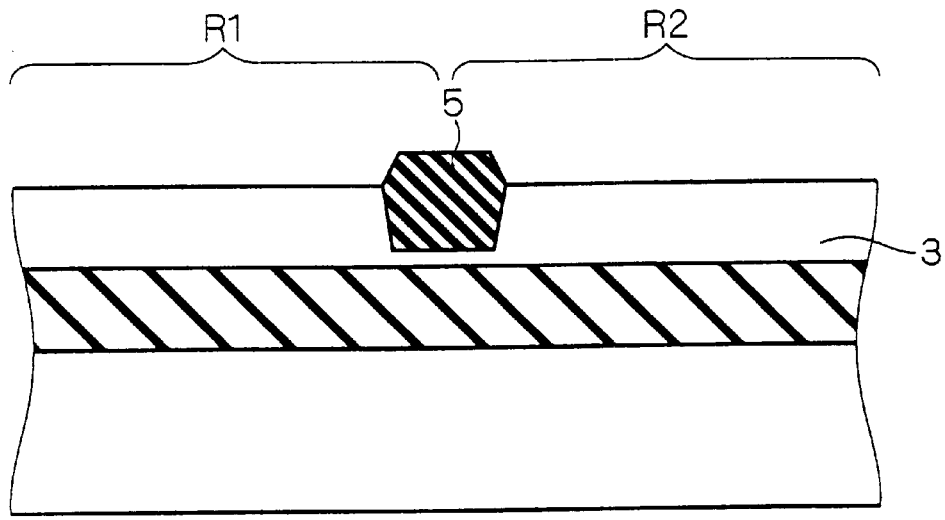
Figure 46:
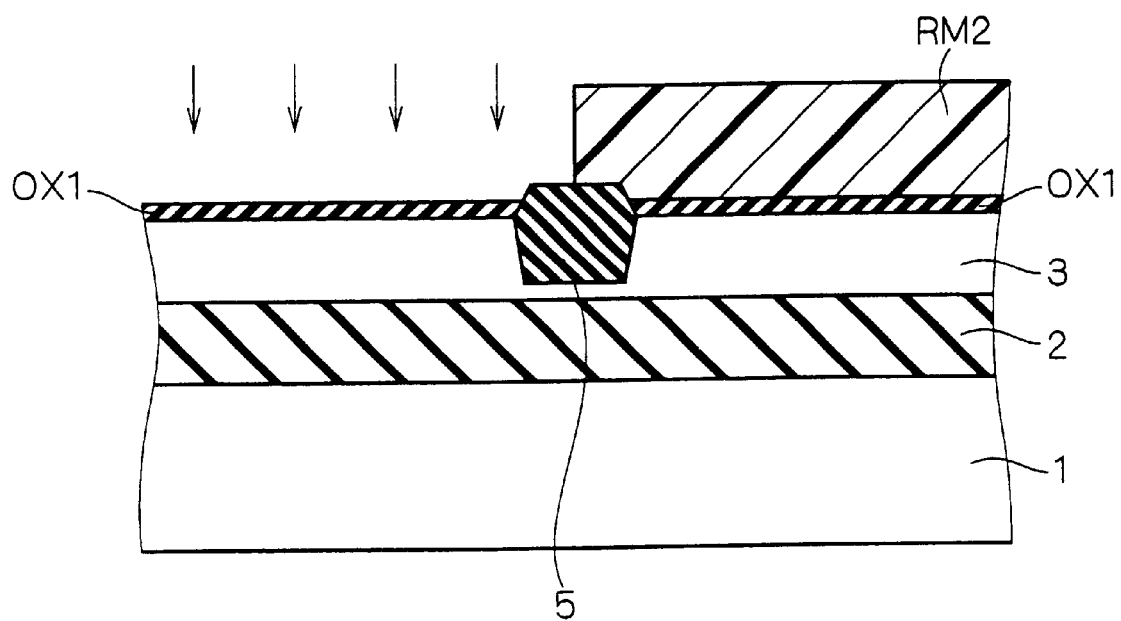
Figure 47:
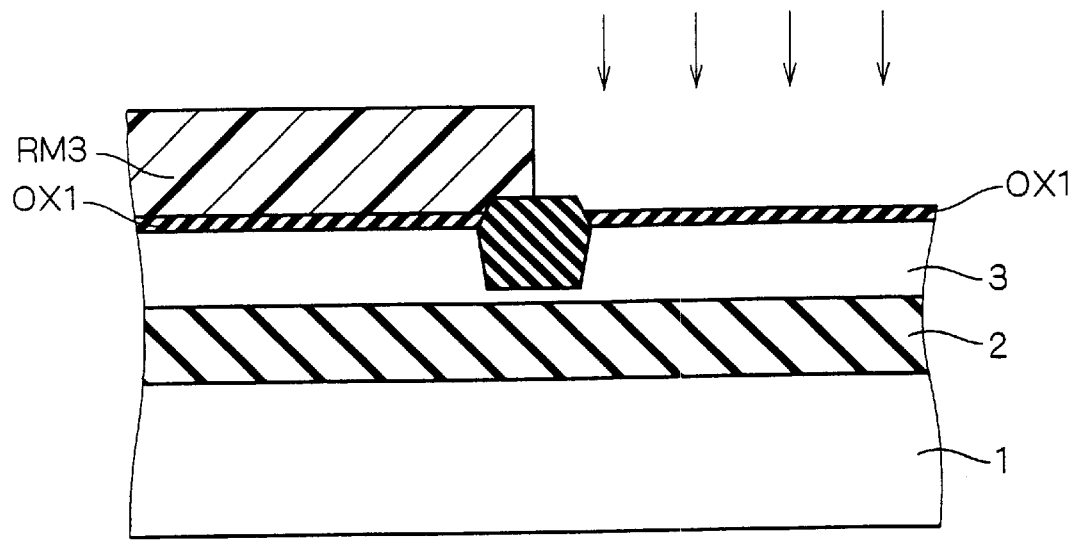
Figure 48:
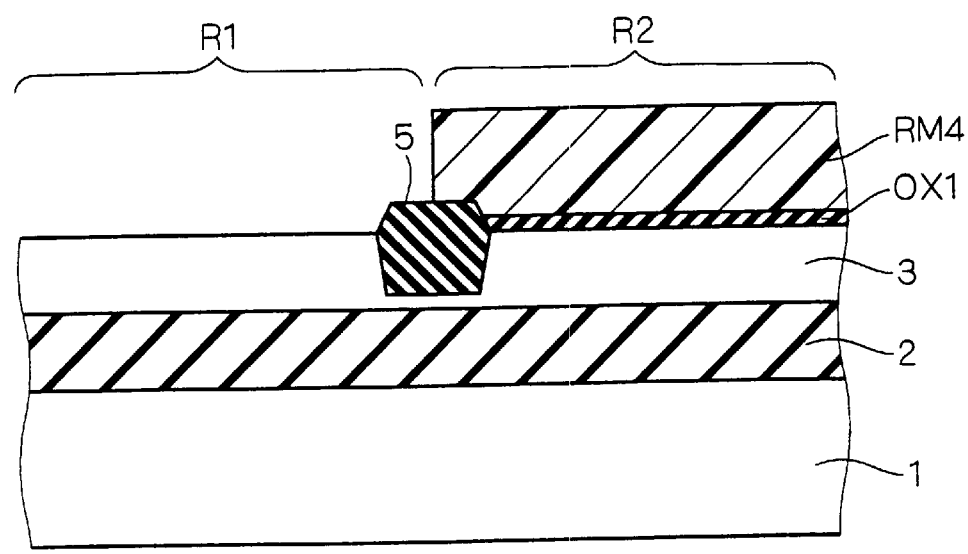
Figure 49:
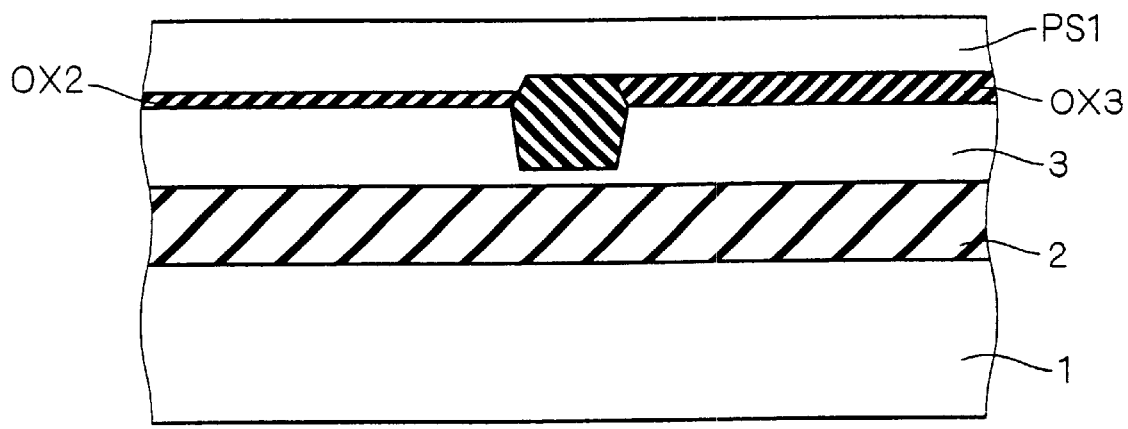
Figure 50:
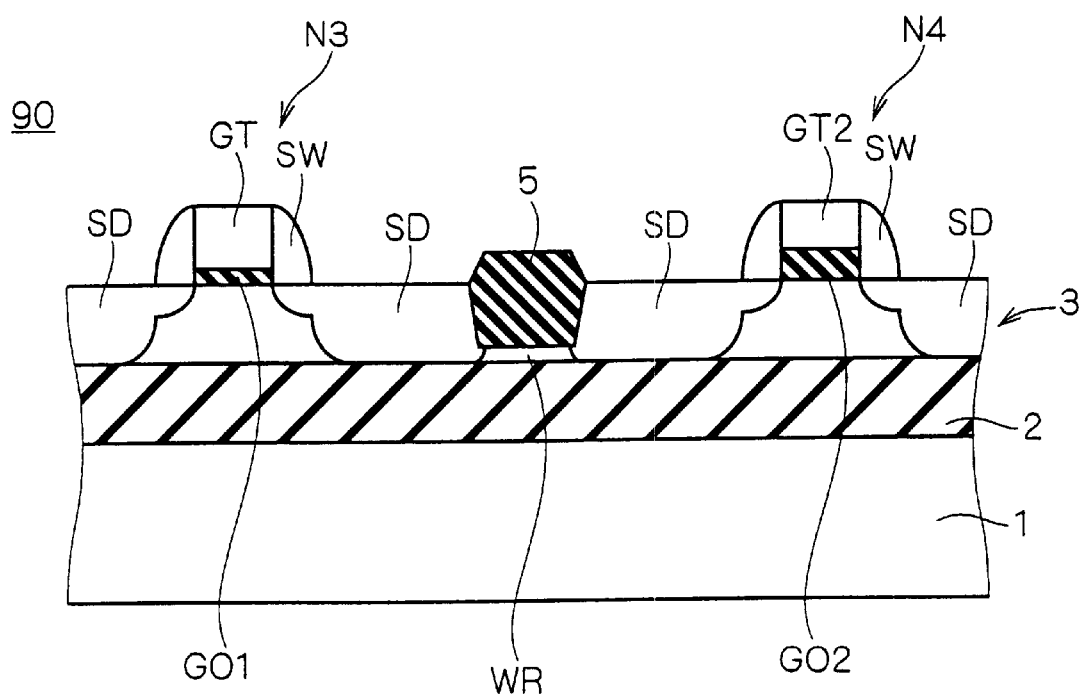
FIG. 50 is a sectional view illustrating the structure of the conventional semiconductor device.

FIG. 40 shows a step of covering the body region BR and the PMOS transistor (not shown) with a resist mask RM32 and implanting an n-type impurity into the source/drain layer of the NMOS transistor M11 (and M12).

While the order of the steps shown in FIGS. 39 and 40 is not limited, the body region BR and the channel region of the NMOS transistor M11 (and M12) must be connected through the p-type impurity region.

When implanting the p-type impurity, therefore, the partial isolation oxide film PT1 must be covered with the resist mask RM32 for preventing implantation of the n-type impurity through the partial isolation oxide film PT1. However, the partial isolation oxide film PT1 may be incompletely covered due to displacement of the resist mask RM32 or the like, and the n-type impurity may pass through the partial isolation oxide film PT1 if the thickness thereof is small.

In the present invention, however, the shapes of the edge portions are controlled in the partial isolation oxide film, the full isolation oxide film and the combined isolation oxide film for controlling the shape on the edge portion defining an element edge while keeping the thicknesses in the remaining portions, whereby it is possible to prevent such a phenomenon that the isolation oxide films are so thin that an undesirable impurity passes through the same.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a buried oxide film arranged on said semiconductor substrate;
   an SOI substrate comprising an SOI layer arranged on said buried oxide film;
   a plurality of semiconductor elements formed on said SOI layer; and
   a trench isolation oxide film obtained by burying an oxide film in a trench formed in the surface of said SOI layer, for electrically isolating said plurality of semiconductor elements by said trench isolation oxide film, wherein
   said trench isolation oxide film has different contour shapes of its upper edge portion on the left and right edges in a brachydirectional section of said trench isolation oxide film.

2. The semiconductor device according to claim 1, wherein
   said trench isolation oxide film has such a contour shape that said upper edge portion projects into the surface of said SOI layer in the form of a bird's beak.

3. The semiconductor device according to claim 1, wherein
   said trench isolation oxide film has different shapes on the left and right sides in its brachydirectional section, and combinationally includes:
   a full trench structure reaching said buried oxide film through said SOI layer, and
   a partial trench structure having said SOI layer on its lower portion.

4. The semiconductor device according to claim 2, wherein
   the height of a protrusion on a base portion of said upper edge portion projecting in the form of said bird's beak on the side of a full trench structure reaching said buried oxide film through said SOI layer is relatively small, and
   the height of a protrusion on a base portion of said upper edge portion projecting in the form of said bird's beak on the side of a partial trench structure having said SOI layer on its lower portion is relatively large.

5. The semiconductor device according to claim 2, wherein
   the length of said upper edge portion projecting in the form of said bird's beak on the side of a full trench structure reaching said buried oxide film through said SOI layer is relatively large, and
   the length of said upper edge portion projecting in the form of said bird's beak on the side of a partial trench structure having said SOI layer on its lower portion is relatively small.

6. The semiconductor device according to claim 5, wherein
   said trench isolation oxide film has different contour shapes of a base portion of said upper edge portion projecting in the form of said bird's beak on the side of said partial trench structure between a first inclined portion along a direction separating from said SOI layer and a second inclined portion directed toward said SOI layer,
   said first inclined portion has a substantially linear contour shape, and
   said second inclined portion has a contour shape roundedly projecting toward said SOI layer.

7. The semiconductor device according to claim 5, wherein
   said trench isolation oxide film has different contour shapes of a base portion of said upper edge portion projecting in the form of said bird's beak on the side of said partial trench structure between a first inclined portion along a direction separating from said SOI layer and a second inclined portion directed toward said SOI layer,
   said first inclined portion has a contour shape roundedly depressed toward said SOI layer, and
   said second inclined portion has a contour shape roundedly projecting toward said SOI layer.

8. The semiconductor device according to claim 1, wherein
   said trench isolation oxide film has such a contour shape that its lower edge portion projects between said SOI layer and said buried oxide film.

* * * * *